(12) United States Patent
Hamada et al.

(10) Patent No.: US 11,691,416 B2
(45) Date of Patent: Jul. 4, 2023

(54) PIEZOELECTRIC ELEMENT, LIQUID EJECTING HEAD, AND LIQUID EJECTING APPARATUS

(71) Applicant: Seiko Epson Corporation, Toyko (JP)

(72) Inventors: Yasuaki Hamada, Chino (JP); Shunsuke Yoshida, Shiojiri (JP); Yasuhiro Itayama, Kai (JP); Toshihiro Shimizu, Fujimi (JP); Masao Nakayama, Shiojiri (JP)

(73) Assignee: SEIKO EPSON CORPORATION

( * ) Notice: Subject to any disclaimer, the term of this patent is extended or adjusted under 35 U.S.C. 154(b) by 120 days.

(21) Appl. No.: 17/325,264

(22) Filed: May 20, 2021

(65) Prior Publication Data

US 2021/0362495 A1 Nov. 25, 2021

(30) Foreign Application Priority Data

May 21, 2020 (JP) ................. 2020-088643

(51) Int. Cl.
*B41J 2/045* (2006.01)
*H10N 30/87* (2023.01)
*H10N 30/853* (2023.01)

(52) U.S. Cl.
CPC ....... *B41J 2/04588* (2013.01); *B41J 2/04581* (2013.01); *H10N 30/87* (2023.02); *H10N 30/8554* (2023.02)

(58) Field of Classification Search
CPC .... B41J 2/04588; B41J 2/04581; B41J 2/161; B41J 2/1623; B41J 2/1628; B41J 2/1629; B41J 2/1631; B41J 2/1646; B41J 2202/03; B41J 2202/11; B41J 2/14233; B41J 2002/14362; B41J 2002/14419; B41J 2002/14491; B41J 2/14274; B41J 2/01; H10N 30/87; H10N 30/8554; H10N 30/078; H10N 30/877; H10N 30/2047
See application file for complete search history.

(56) References Cited

U.S. PATENT DOCUMENTS

2010/0110148 A1 5/2010 Kuriki et al.

FOREIGN PATENT DOCUMENTS

JP 2010-135748 A 6/2010

OTHER PUBLICATIONS

Kusunoki, Ryutaro et al., "InkJet Head", Feb. 7, 2018, Paragraph 0048 (Year: 2018).*
IP.com search (Year: 2023).*

* cited by examiner

*Primary Examiner* — Lisa Solomon
(74) *Attorney, Agent, or Firm* — Harness, Dickey & Pierce, P.L.C.

(57) ABSTRACT

An electric current based on electric charge produced on the piezoelectric body changes by going through a first path, a second path, a third path, and a fourth path in this order. On the first path, the electric current becomes larger as the voltage becomes higher. On the second path, the electric current becomes smaller as the voltage becomes higher. On the third path, the electric current becomes larger as the voltage becomes higher. On the fourth path, the electric current becomes smaller as the voltage becomes higher.

31 Claims, 16 Drawing Sheets

PIEZOELECTRIC ELEMENT, LIQUID EJECTING HEAD, AND LIQUID EJECTING APPARATUS

The present application is based on, and claims priority from JP Application Serial Number 2020-088643, filed May 21, 2020, the disclosure of which is hereby incorporated by reference herein in its entirety.

BACKGROUND

1. Technical Field

Embodiments of the present disclosure relate to a piezoelectric element, a liquid ejecting head, and a liquid ejecting apparatus.

2. Related Art

For devices of piezoelectric-type ink-jet printers, piezoelectric elements are used. For example, a piezoelectric element disclosed in JP-A-2010-135748 includes a piezoelectric layer made of lead zirconate titanate (PZT) whose saturation polarization, remanent polarization, and coercive electric field in polarization-field hysteresis characteristics satisfy predetermined conditions.

Since the piezoelectric element disclosed in JP-A-2010-135748 has comparatively large remanent polarization, if a voltage applied to the piezoelectric layer changes between positive and negative, it is difficult for the polarization direction of the piezoelectric layer to change near the timing at which the voltage becomes zero. For this reason, if the piezoelectric element disclosed in JP-A-2010-135748 is used, it is difficult to enhance the response performance of deformation of the piezoelectric layer in response to a change in a drive voltage so as to meet recent demands for making the speed of piezoelectric elements higher.

SUMMARY

A piezoelectric element according to a certain aspect of the present disclosure includes: a first electrode; a second electrode; and a piezoelectric body disposed between the first electrode and the second electrode; wherein let a positive saturation voltage be defined as a positive voltage applied between the first electrode and the second electrode when electric charge produced on the piezoelectric body becomes saturated, let a negative saturation voltage be defined as a negative voltage applied between the first electrode and the second electrode when electric charge produced on the piezoelectric body becomes saturated, given the definition, when a voltage applied between the first electrode and the second electrode is changed progressively from the negative saturation voltage to the positive saturation voltage, an electric current based on electric charge produced on the piezoelectric body changes by going through a first path, a second path, a third path, and a fourth path in this order, on the first path, the electric current becomes larger as the voltage becomes higher, on the second path, the electric current becomes smaller as the voltage becomes higher, on the third path, the electric current becomes larger as the voltage becomes higher, and on the fourth path, the electric current becomes smaller as the voltage becomes higher.

A piezoelectric element according to another aspect of the present disclosure includes: a first electrode; a second electrode; and a piezoelectric body disposed between the first electrode and the second electrode; wherein let a positive saturation voltage be defined as a positive voltage applied between the first electrode and the second electrode when electric charge produced on the piezoelectric body becomes saturated, let a negative saturation voltage be defined as a negative voltage applied between the first electrode and the second electrode when electric charge produced on the piezoelectric body becomes saturated, given the definition, when a voltage applied between the first electrode and the second electrode is changed progressively from the positive saturation voltage to the negative saturation voltage, an electric current based on electric charge produced on the piezoelectric body changes by going through a fifth path, a sixth path, a seventh path, and an eighth path in this order, on the fifth path, the electric current becomes smaller as the voltage becomes lower, on the sixth path, the electric current becomes larger as the voltage becomes lower, on the seventh path, the electric current becomes smaller as the voltage becomes lower, and on the eighth path, the electric current becomes larger as the voltage becomes lower.

A liquid ejecting head according to a certain aspect of the present disclosure includes: the piezoelectric element according to either one of the aspects mentioned above; and a pressure compartment substrate having a pressure compartment which contains liquid and inside which pressure is applied to the liquid by driving of the piezoelectric element.

A liquid ejecting apparatus according to a certain aspect of the present disclosure includes: the liquid ejecting head according to the aspect mentioned above; and a control section that controls the driving of the piezoelectric element.

DESCRIPTION OF EXEMPLARY EMBODIMENTS

Figure 1:
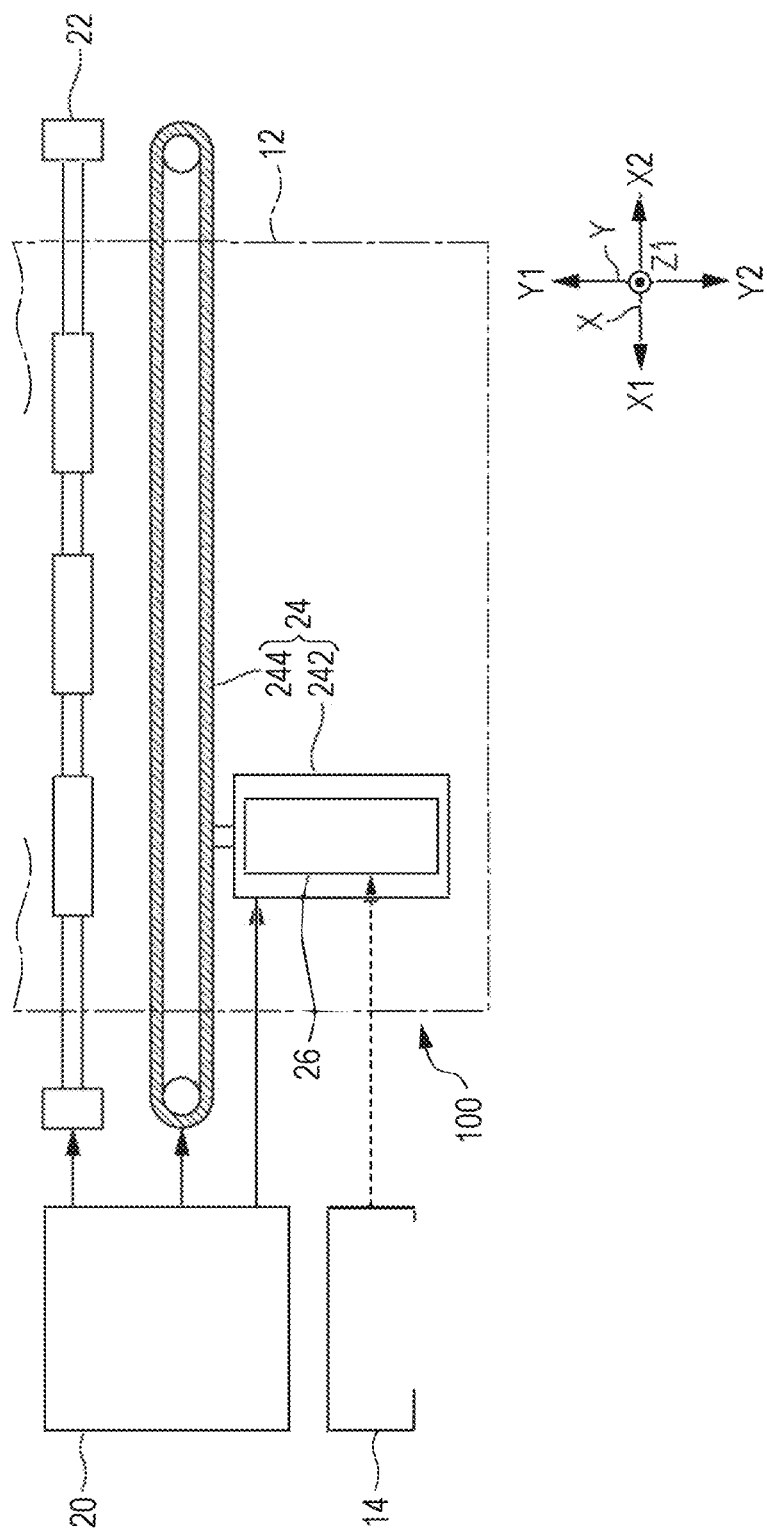
FIG. 1 is a schematic view of an example of the configuration of a liquid ejecting apparatus according to an exemplary embodiment.

With reference to the accompanying drawings, some preferred embodiments of the present disclosure will now be described. The dimensions or scales of parts illustrated in the drawings may be different from actual dimensions or scales, and some parts may be schematically illustrated for easier understanding. The scope of the present disclosure shall not be construed to be limited to these specific examples unless and except where the description below contains an explicit mention of limiting the present disclosure.

The description below is given with reference to X, Y, and Z axes intersecting with one another. One direction along the X axis will be referred to as the X1 direction. The direction that is the opposite of the X1 direction will be referred to as the X2 direction. Similarly, directions that are the opposite of each other along the Y axis will be referred to as the Y1 direction and the Y2 direction. Directions that are the opposite of each other along the Z axis will be referred to as the Z1 direction and the Z2 direction. View in the direction along the Z axis will be referred to as "plan view".

Typically, the Z axis is a vertical axis, and the Z2 direction corresponds to a vertically downward direction. However, the Z axis does not necessarily have to be a vertical axis. The X, Y, and Z axes are typically orthogonal to one another, but are not limited thereto. It is sufficient as long as the X, Y, and Z axes intersect with one another within an angular range of, for example, 80° or greater and 100° or less.

1. Exemplary Embodiments

1-1. Overall Configuration of Liquid Ejecting Apparatus

FIG. 1 is a schematic view of an example of the configuration of a liquid ejecting apparatus 100 according to an exemplary embodiment. The liquid ejecting apparatus 100 is an ink-jet-type printing apparatus that ejects droplets of ink, which is an example of a liquid, onto a medium 12. A typical example of the medium 12 is printing paper. The medium 12 is not limited to printing paper. The medium 12 may be a print target made of any material such as, for example, a resin film or a cloth.

As illustrated in FIG. 1, a liquid container 14 that contains ink is attached to the liquid ejecting apparatus 100. Some specific examples of the liquid container 14 are: a cartridge that can be detachably attached to the liquid ejecting apparatus 100, a bag-type ink pack made of a flexible film material, an ink tank which can be refilled with ink, etc. Any type of ink may be contained in the liquid container 14.

The liquid ejecting apparatus 100 includes a control unit 20, a transport mechanism 22, a movement mechanism 24, and a liquid ejecting head 26. The control unit 20 includes a processing circuit, for example, a CPU (central processing unit) or an FPGA (field programmable gate array), and a storage circuit such as a semiconductor memory, etc., and controls the operation of components of the liquid ejecting apparatus 100. The control unit 20 is an example of "a control section" and controls the driving of piezoelectric elements 44 described later.

The transport mechanism 22 transports the medium 12 in the Y2 direction in accordance with control by the control unit 20. The movement mechanism 24 reciprocates the liquid ejecting head 26 in the X1 direction and the X2 direction in accordance with control by the control unit 20. In the example illustrated in FIG. 1, the movement mechanism 24 includes a box-like traveler 242 called as a carriage that houses the liquid ejecting head 26, and a transport belt 244 to which the traveler 242 is fixed. The number of the liquid ejecting head(s) 26 mounted on the traveler 242 is not limited to one. Two or more liquid ejecting heads 26 may be mounted. In addition to the liquid ejecting head 26, the liquid container(s) 14 mentioned above may be mounted on the traveler 242.

In accordance with control by the control unit 20, ink supplied from the liquid container 14 is ejected by the liquid ejecting head 26 from each of a plurality of nozzles toward the medium 12 in the Z2 direction. An image is formed on the surface of the medium 12 as a result of the ejection performed with the transportation of the medium 12 by the transport mechanism 22 and with the reciprocation of the liquid ejecting head 26 by the movement mechanism 24.

1-2. Overall Configuration of Liquid Ejecting Head

Figure 2:
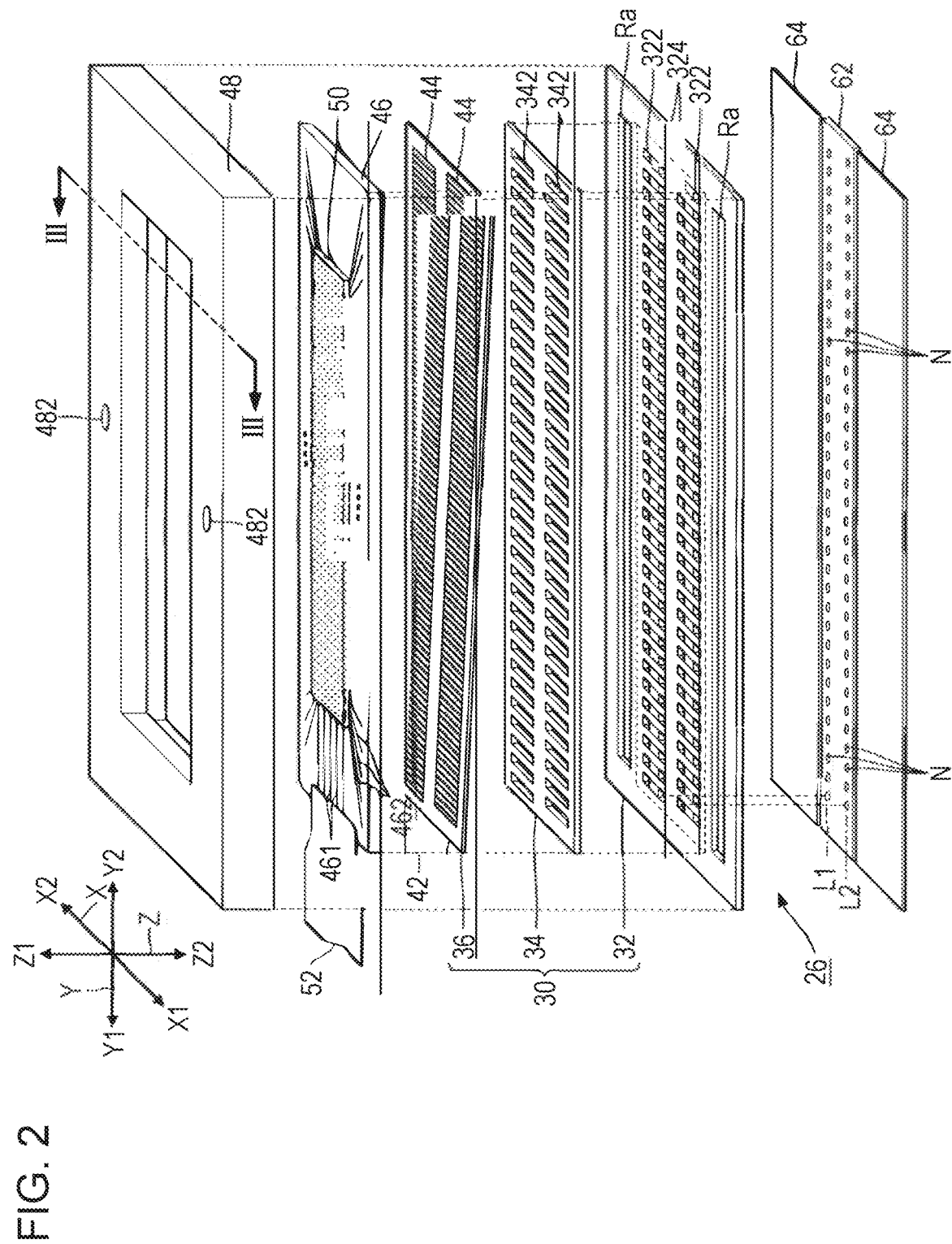
FIG. 2 is an exploded perspective view of a liquid ejecting head according to an exemplary embodiment.
Figure 3:
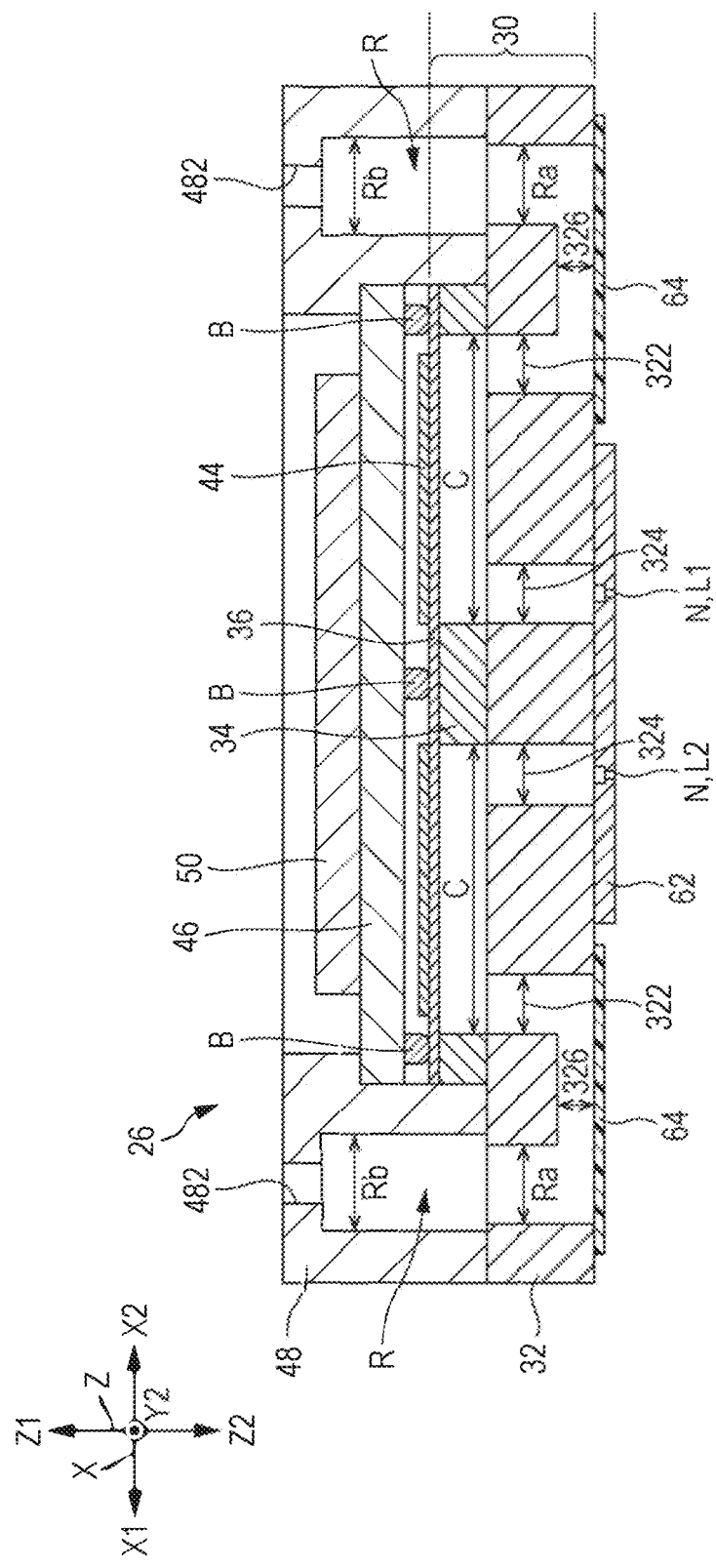
FIG. 3 is a cross-sectional view taken along the line III-III of FIG. 2.

FIG. 2 is an exploded perspective view of the liquid ejecting head 26 according to an exemplary embodiment. FIG. 3 is a cross-sectional view taken along the line III-III of FIG. 2. As illustrated in FIG. 2, the liquid ejecting head 26 includes a plurality of nozzles N arranged in the direction along the Y axis. In the example illustrated in FIG. 2, the plurality of nozzles N is grouped into a first row L1 and a second row L2, which are arranged next to each other, with a space in the X axis therebetween. Each of the first row L1 and the second row L2 is a group of nozzles N arranged linearly in the direction along the Y axis. The liquid ejecting head 26 has a substantially symmetric structure, in which components that are related to the nozzles N belonging to the first row L1 and components that are related to the nozzles N belonging to the second row L are substantially symmetrical with each other in the direction along the X axis.

The positions of the nozzles N belonging to the first row L1 and the positions of the nozzles N belonging to the second row L2 may be the same as one another in the direction along the Y axis; the positions of the nozzles N belonging to the first row L1 and the positions of the nozzles N belonging to the second row L2 may be different from one another in the direction along the Y axis. Either the components that are related to the nozzles N belonging to the first row L1 or the components that are related to the nozzles N belonging to the second row L2 may be omitted. Disclosed below is a structure example in which the positions of the nozzles N belonging to the first row L1 and the positions of the nozzles N belonging to the second row L2 are the same as one another in the direction along the Y axis.

As illustrated in FIGS. 2 and 3, the liquid ejecting head 26 includes a flow passage structure module 30, a nozzle plate 62, a vibration absorber 64, a diaphragm 36, a wiring substrate 46, a housing 48, and a drive circuit 50.

The flow passage structure module 30 is a structure module inside which flow passages for supplying ink to the plurality of nozzles N are formed. The flow passage structure module 30 according to the present embodiment includes a flow passage substrate 32 and a pressure compartment substrate 34, which are stacked in this order in the Z1 direction. Each of the flow passage substrate 32 and the pressure compartment substrate 34 is a rectangular plate-like member whose longer-side direction is along the Y axis. The flow passage substrate 32 and the pressure compartment substrate 34 are bonded to each other by means of, for example, an adhesive.

The diaphragm 36, the wiring substrate 46, the housing 48, and the drive circuit 50 are provided at an area located over the flow passage structure module 30 in the Z1 direction. The nozzle plate 62 and the vibration absorber 64 are provided at an area located under the flow passage structure module 30 in the Z2 direction. Schematically speaking, similarly to the flow passage substrate 32 and the pressure compartment substrate 34, each of the components of the liquid ejecting head 26 is a rectangular plate-like member whose longer-side direction is along the Y axis, and these components are stacked and bonded to each other by means of, for example, an adhesive.

The nozzle plate 62 is a plate-like member in which the plurality of nozzles N is formed. Each of the plurality of nozzles N is a circular through hole, through which ink is ejected. The nozzle plate 62 is manufactured by processing a monocrystalline silicon substrate by using a semiconductor manufacturing technique such as, for example, dry etching or wet etching, etc. However, any other known method and material may be used for manufacturing the nozzle plate 62.

A space Ra, a plurality of supply flow passages 322, a plurality of communication flow passages 324, and a supply liquid chamber 326 are formed inside the flow passage substrate 32 for each of the first row L1 and the second row L2. The space Ra is an elongated opening that extends in the direction along the Y axis when viewed in plan in the direction along the Z axis. Each of the supply flow passage 322 and the communication flow passage 32 is a through hole formed individually for the corresponding one of the nozzles N. The supply liquid chamber 326 is a space that has its longer side extending in the direction along the Y axis throughout the plurality of nozzles N. The supply liquid chamber 326 provides flow communication between the space Ra and the plurality of supply flow passages 322. In plan view, each of the plurality of communication flow passages 324 overlaps with the corresponding one of the nozzles N, which corresponds to this communication flow passage 324.

The pressure compartment substrate 34 is a plate-like member inside which a plurality of pressure compartments C called as cavities is formed for each of the first row L1 and the second row L2. The pressure compartments C are arranged in the direction along the Y axis. Each of the plurality of pressure compartments C is a space that is formed individually for the corresponding one of the plurality of nozzles N and has its longer side extending in the direction along the X axis in plan view. Similarly to the nozzle plate 62 mentioned above, each of the flow passage substrate 32 and the pressure compartment substrate 34 is manufactured by, for example, processing a monocrystalline silicon substrate by using a semiconductor manufacturing technique. However, any other known method and material may be used for manufacturing each of the flow passage substrate 32 and the pressure compartment substrate 34.

The pressure compartment C is a space located between the flow passage substrate 32 and the diaphragm 36. The plural pressure compartments C are arranged in the direction along the Y axis for each of the first row L1 and the second row L2. The pressure compartment C is in communication with the communication flow passage 324 and the supply flow passage 322. Therefore, the pressure compartment C is in communication with the nozzle N through the communication flow passage 324 and is in communication with the space Ra through the supply flow passage 322 and the supply liquid chamber 326.

The diaphragm 36 is provided on the Z1-directional surface of the pressure compartment substrate 34. The diaphragm 36 is a plate-like member that is able to elastically vibrate. The diaphragm 36 will be described in detail later.

For each of the first row L1 and the second row L2, the plurality of piezoelectric elements 44 corresponding to the nozzles N respectively is provided on the Z1-directional surface of the diaphragm 36. Each of the plurality of piezoelectric elements 44 is a passive element that deforms by receiving supply of a drive signal. Each of the plurality of piezoelectric elements 44 has an elongated shape with its longer side extending in the direction along the X axis in plan view. The plural piezoelectric elements 44 are arranged in the direction along the Y axis in such a way as to correspond to the plural pressure compartments C respectively. The diaphragm 36 vibrates by being driven by the deformation of the piezoelectric element 44. The vibration causes a change in pressure inside the pressure compartment C. Due to the change in pressure, ink is ejected from the nozzle N. The piezoelectric element 44 will be described in detail later.

The housing 48 is a case for temporarily containing ink that is to be supplied to the plurality of pressure compartments C. As illustrated in FIG. 3, for each of the first row L1 and the second row L2, a space Rb is formed in the housing 48 according to the present embodiment. The space Rb of the housing 48 and the space Ra of the flow passage substrate 32 are in communication with each other. A combined space made up of the space Ra and the space Rb serves as a liquid temporarily-containing chamber (reservoir) R for temporarily containing ink that is to be supplied to the plurality of pressure compartments C. Ink is supplied to the liquid temporarily-containing chamber R through an inlet 482 formed through the housing 48. The ink inside the liquid temporarily-containing chamber R is supplied to the pressure compartment C through the supply liquid chamber 326 and each supply flow passage 322. The vibration absorber 64 is a flexible film (compliance substrate) that constitutes the floor of the liquid temporarily-containing chamber R. The vibration absorber 64 absorbs changes in pressure of the ink inside the liquid temporarily-containing chamber R.

The wiring substrate 46 is a plate-like member on which wiring for electric connection between the drive circuit 50 and the plurality of piezoelectric elements 44 is formed. The Z2-directional surface of the wiring substrate 46 is bonded to the diaphragm 36, with a plurality of conductive bumps B provided therebetween. The drive circuit 50 is mounted on the Z1-directional surface of the wiring substrate 46. The drive circuit 50 is an IC (Integrated Circuit) chip that outputs a reference signal and a drive signal for driving each of the plurality of piezoelectric elements 44. The wiring substrate 46 is not limited to a rigid substrate. For example, the wiring substrate 46 may be an FPC (Flexible Printed Circuit) or an FFC (Flexible Flat Cable). In this case, the drive circuit 50 may be mounted on the wiring substrate 46. The wiring substrate 46 may serve also as external wiring 52.

An end portion of the external wiring 52 is bonded to the Z1-directional surface of the wiring substrate 46. The external wiring 52 is made of a connection part such as, for example, an FPC (Flexible Printed Circuit) or an FFC (Flexible Flat Cable). As illustrated in FIG. 2, a plurality of wires 461 for electric connection between the external wiring 52 and the drive circuit 50 and a plurality of wires 462 via which the drive signal and the reference signal outputted from the drive circuit 50 are supplied are formed on the wiring substrate 46.

1-3. Details on Diaphragm and Piezoelectric Element

Figure 4:
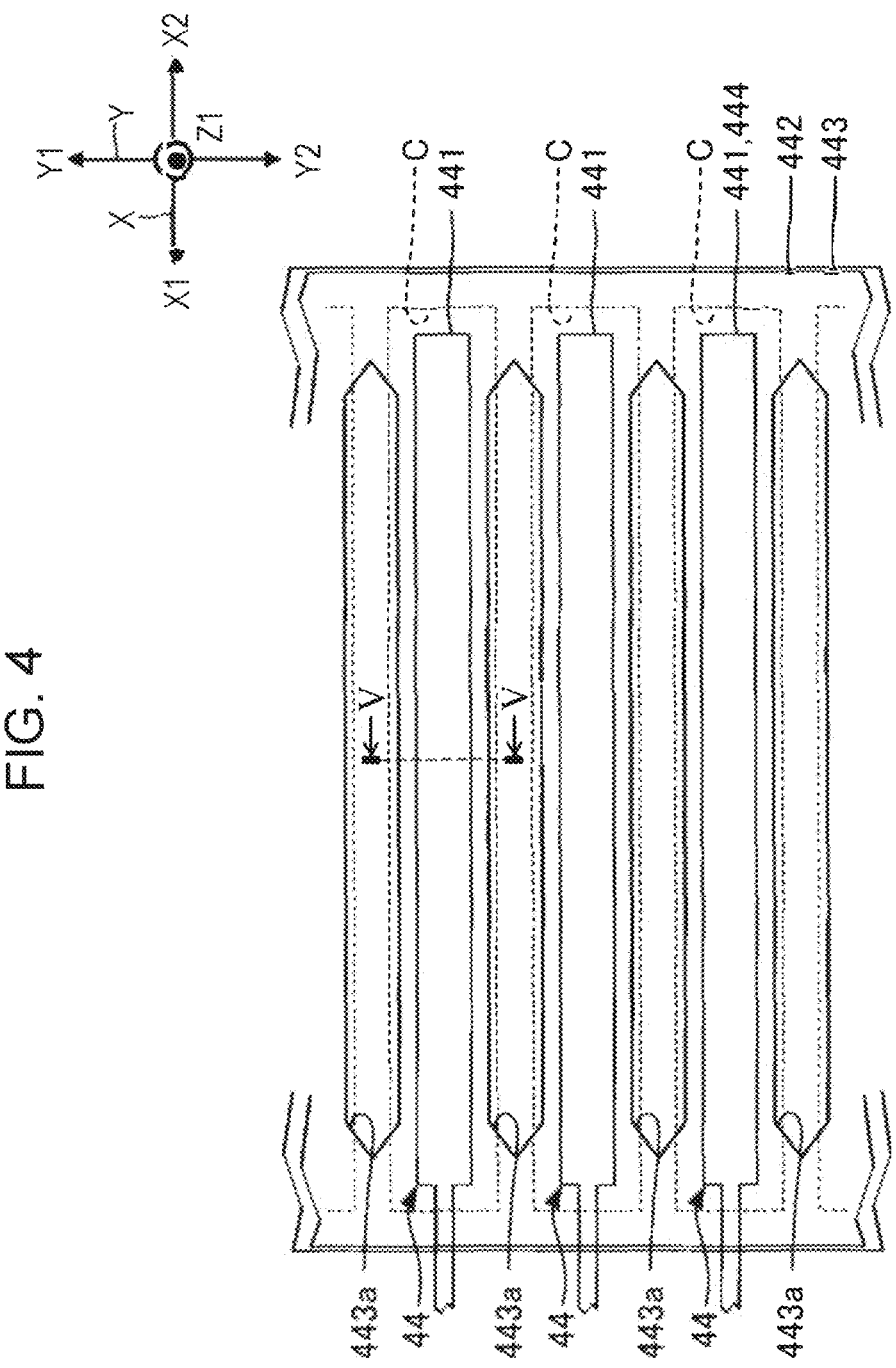
FIG. 4 is a plan view that illustrates piezoelectric elements according to an exemplary embodiment.
Figure 5:
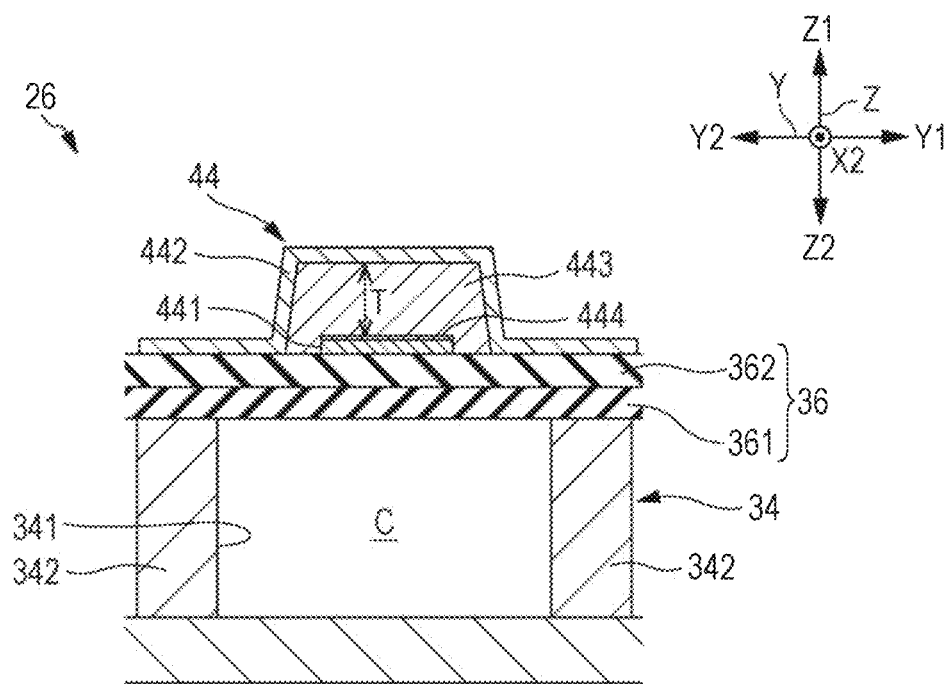
FIG. 5 is a cross-sectional view taken along the line V-V of FIG. 4.

FIG. 4 is a plan view that illustrates the piezoelectric elements 44 according to an exemplary embodiment. FIG. 5 is a cross-sectional view taken along the line V-V of FIG. 4. In the liquid ejecting head 26, as illustrated in FIG. 5, the pressure compartment substrate 34, the diaphragm 36, and the plurality of piezoelectric elements 44 are stacked in this order in the Z1 direction.

As illustrated in FIG. 5, cavities 341 that constitute the pressure compartments C are formed in the pressure compartment substrate 34. In the pressure compartment substrate 34, a partition wall 342 extending in the direction along the X axis is formed each between two cavities 341 located next to each other. In FIG. 4, the shape of the cavity 341 in plan view is illustrated by broken lines. The pressure compartment substrate 34 is formed by, for example, performing anisotropic etching of a monocrystalline silicon substrate. For example, a potassium hydroxide solution (KOH), etc. is used as an etchant for anisotropic etching. In anisotropic etching, a first layer 361, which will be described later, is used as an etching stopper layer.

In FIG. 4, the shape of the cavity 341 in plan view is a rectangle, but is not limited thereto. The cavity 341 may have any shape in plan view. For example, if a monocrystalline silicon substrate having crystal face orientation (110) is etched using anisotropic etching, the shape of the cavity 341 in plan view will be a parallelogram.

As illustrated in FIG. 5, the diaphragm 36 includes a first layer 361 and a second layer 362. The first layer 361 and the second layer 362 are stacked in this order in the Z1 direction. The first layer 361 is, for example, an elastic film made of silicon oxide ($SiO_2$). For example, the elastic film is formed by thermally oxidizing one surface of a monocrystalline silicon substrate. The second layer 362 is, for example, an insulating film made of zirconium oxide ($ZrO_2$). For example, the insulating film is formed by producing a zirconium layer by sputtering and next thermally oxidizing the zirconium layer.

As described above, the second layer 362 of the diaphragm 36 is made of zirconium oxide, and a layer-stacked body 31 contains zirconium oxide. Zirconium oxide has excellent electric insulating property, mechanical strength, and toughness. Therefore, the use of the second layer 362 containing zirconium oxide as a component of the diaphragm 36 makes it possible to enhance the characteristics of the diaphragm 36. As another advantage, even though a piezoelectric body 443, which will be described later, has a part that is not present over a first electrode 441, which will also be described later, this part is present on the second layer 362, and therefore it is easier to preferentially orient this part in the direction of (100) when the piezoelectric body 443 is formed.

Another layer such as a layer of metal oxide, etc. may be provided between the first layer 361 and the second layer 362. A part or a whole of the diaphragm 36 may be formed integrally with the pressure compartment substrate 34 by using the same material. The diaphragm 36 may be configured as a layer of a single material.

As illustrated in FIG. 4, the piezoelectric elements 44 overlap with the pressure compartments C in plan view. As illustrated in FIG. 5, the piezoelectric element 44 includes the first electrode 441, a seed layer 444, the piezoelectric body 443, and a second electrode 442. The first electrode 441, the seed layer 444, the piezoelectric body 443, and the second electrode 442 are stacked in this order in the Z1 direction. Another layer such as a layer for enhancing adhesion may be provided between one layer and another layer of the piezoelectric element 44, and/or between the piezoelectric element 44 and the diaphragm 36.

The first electrode 441 is an individual electrode disposed for each of the plurality of piezoelectric elements 44, each at a distance from the others. Specifically, the plural first electrodes 441, each of which extends in the direction along the X axis, are arranged in the direction along the Y axis such that they are spaced from one another. To the first electrode 441 of each of the plurality of piezoelectric elements 44, a drive signal for ejecting ink from the nozzle N corresponding to this piezoelectric element 44 is applied from the drive circuit 50.

The first electrode 441 includes, for example, a first layer made of titanium (Ti), a second layer made of platinum (Pt), and a third layer made of iridium (Ir). The first, second, and third layers are stacked in this order in the Z1 direction. The first electrode 441 is formed using, for example, a known film deposition technique such as sputtering and a known processing technique using photolithography and etching, etc.

The first layer mentioned above serves as an adhesion layer for enhancing the adhesion of the first electrode 441 to the diaphragm 36. The thickness of the first layer is not specifically limited. For example, the first layer has a thickness of 3 nm or greater and 50 nm or less approximately. Chromium may be used as the material of the first layer in place of titanium.

Both of metal of the second layer mentioned above and metal of the third layer mentioned above are electrode materials having excellent electric conductivity. In addition, the chemical properties of them are close to each other. Therefore, it is possible to make the electrode characteristics of the first electrode 441 excellent. The thickness of the second layer is not specifically limited. For example, the second layer has a thickness of 50 nm or greater and 200 nm or less approximately. The thickness of the third layer is not specifically limited. For example, the third layer has a thickness of 4 nm or greater and 20 nm or less approximately.

In the first electrode 441, either the second layer or the third layer may be omitted, or a layer made of iridium may be further provided between the first layer and the second layer. A layer made of an electrode material other than iridium and platinum may be used in place of the second layer and the third layer or in addition to the second layer and the third layer. An example of such an electrode material is metal such as aluminum (Al), nickel (Ni), gold (Au), copper (Cu), etc. Any one of these kinds of the material may be used alone, or any two or more of these kinds of the material may be used in combination in the form of stacked layers, alloy, or the like.

The second electrode 442 is a band-shaped common electrode extending in the direction along the Y axis continuously throughout the plurality of piezoelectric elements 44. A predetermined reference voltage is applied to the second electrode 442.

The second electrode 442 includes, for example, a layer made of iridium (Ir) and a layer made of titanium (Ti). These layers are stacked in this order in the Z1 direction. The second electrode 442 is formed using, for example, a known film deposition technique such as sputtering and a known processing technique using photolithography and etching, etc.

The material of the second electrode 442 is not limited to iridium and titanium. For example, the second electrode 442 may be made of metal such as aluminum (Al), nickel (Ni), gold (Au), copper (Cu), etc. The second electrode 442 may be formed using any one of these kinds of the metal material alone, or using any two or more of these kinds of the metal material in combination in the form of stacked layers, alloy, or the like. The second electrode 442 may be configured as a single layer. However, preferably, iridium, or iridium oxide with less oxygen content than a stoichiometric composition may be used as the material of the second electrode 442.

The piezoelectric body 443 is disposed between the first electrode 441 and the second electrode 442. The piezoelectric body 443 has a band-like shape extending in the direction along the Y axis continuously throughout the plurality of piezoelectric elements 44. In the example illustrated in FIG. 4, in the piezoelectric body 443, a through hole 443a which extends in the direction along the X axis is formed through the piezoelectric body 443 at each area corresponding in plan view to a gap between the pressure compartments C located next to each other. The piezoelectric body 443 may be provided individually for each of the plurality of piezoelectric elements 44.

The piezoelectric body 443 is made of a piezoelectric material that has a perovskite-type crystal structure that is represented by a general composition formula $ABO_3$. Examples of such a piezoelectric material include, for example, lead titanate ($PbTiO_3$), lead zirconate titanate ($Pb(Zr,Ti)O_3$), lead zirconate ($PbZrO_3$), and lead lanthanum titanate (($Pb,La),TiO_3$), lead lanthanum zirconate titanate (($Pb,La) (Zr, Ti)O_3$), lead niobate zirconate titanate ($Pb(Zr, Ti,Nb)O_3$), lead magnesium niobate zirconate titanate ($Pb (Zr,Ti) (Mg,Nb)O_3$), and the like. Among them, lead zirconate titanate is a preferred example that can be used as the material of the piezoelectric body 443. The piezoelectric body 443 may contain a small amount of another element such as impurity.

The piezoelectric body 443 is formed by producing a piezoelectric precursor layer using, for example, a sol-gel method or an MOD (metal organic decomposition) method and then by sintering the precursor layer for crystallization. Although the piezoelectric body 443 may be configured as a single-layer body, it is advantageous to configure the piezoelectric body 443 as a multiple-layer body. The reason is that this will make it easier to keep the characteristics of the piezoelectric body 443 high even when the thickness of the piezoelectric body 443 is increased.

The seed layer 444 is disposed between the first electrode 441 and the piezoelectric body 443. In the example illustrated in FIG. 4, the seed layer 444 is provided at the same area as the area of the first electrode 441 in plan view. It is sufficient as long as the seed layer 444 is disposed between the first electrode 441 and the piezoelectric body 443. For example, the seed layer 444 may be provided at the same area as the area of the piezoelectric body 443.

The seed layer 444 has a function of improving the orientation performance of the piezoelectric body 443 when the piezoelectric body 443 is formed. Specifically, the seed layer 444 is made of, for example, titanium (Ti). If the seed layer 444 is made of titanium, island-shaped Ti forms into a crystalline nucleus to improve the orientation performance of the piezoelectric body 443. In this case, the thickness of the seed layer 444 is not specifically limited. For example, the seed layer 444 has a thickness of 3 nm or greater and 20 nm or less approximately. The seed layer 444, if made of titanium as described above, is formed using, for example, a known film deposition technique such as sputtering and a known processing technique using photolithography and etching, etc. If the seed layer 444 is made of a conductive material such as titanium, it can be said that the seed layer 444 constitutes a part of the first electrode 441.

The seed layer 444 is not limited to a layer made of titanium. For example, the seed layer 444 may be made of a composite oxide that contains, for example, lead, iron, and titanium as its constituent elements. In this case, the piezoelectric body 443 is influenced by the crystal structure of the seed layer 444 when the piezoelectric body 443 is formed and, therefore, the orientation performance of the piezoelectric body 443 improves. Such a composite oxide is, for example, a solid solution of $PbFeO_3$ and $PbTiO_3$, and is represented by $Pb(Fe,Ti)O_3$. The seed layer 444, if made of such a composite oxide, is formed by producing a composite oxide precursor layer using, for example, a sol-gel method or an MOD (metal organic decomposition) method and then by sintering the precursor layer for crystallization.

The piezoelectric element 44 described above includes, as mentioned earlier, the first electrode 441, the second electrode 442, and the piezoelectric body 443 disposed between the first electrode 441 and the second electrode 442. In the piezoelectric element 44 described above, the piezoelectric body 443 deforms according to a voltage that is applied between the first electrode 441 and the second electrode 442. In order to ensure that the performance of the deformation in response to the voltage will be high, the piezoelectric body 443 has electric characteristics described below.

1-4. Electric Characteristics of Piezoelectric Body

Figure 6:
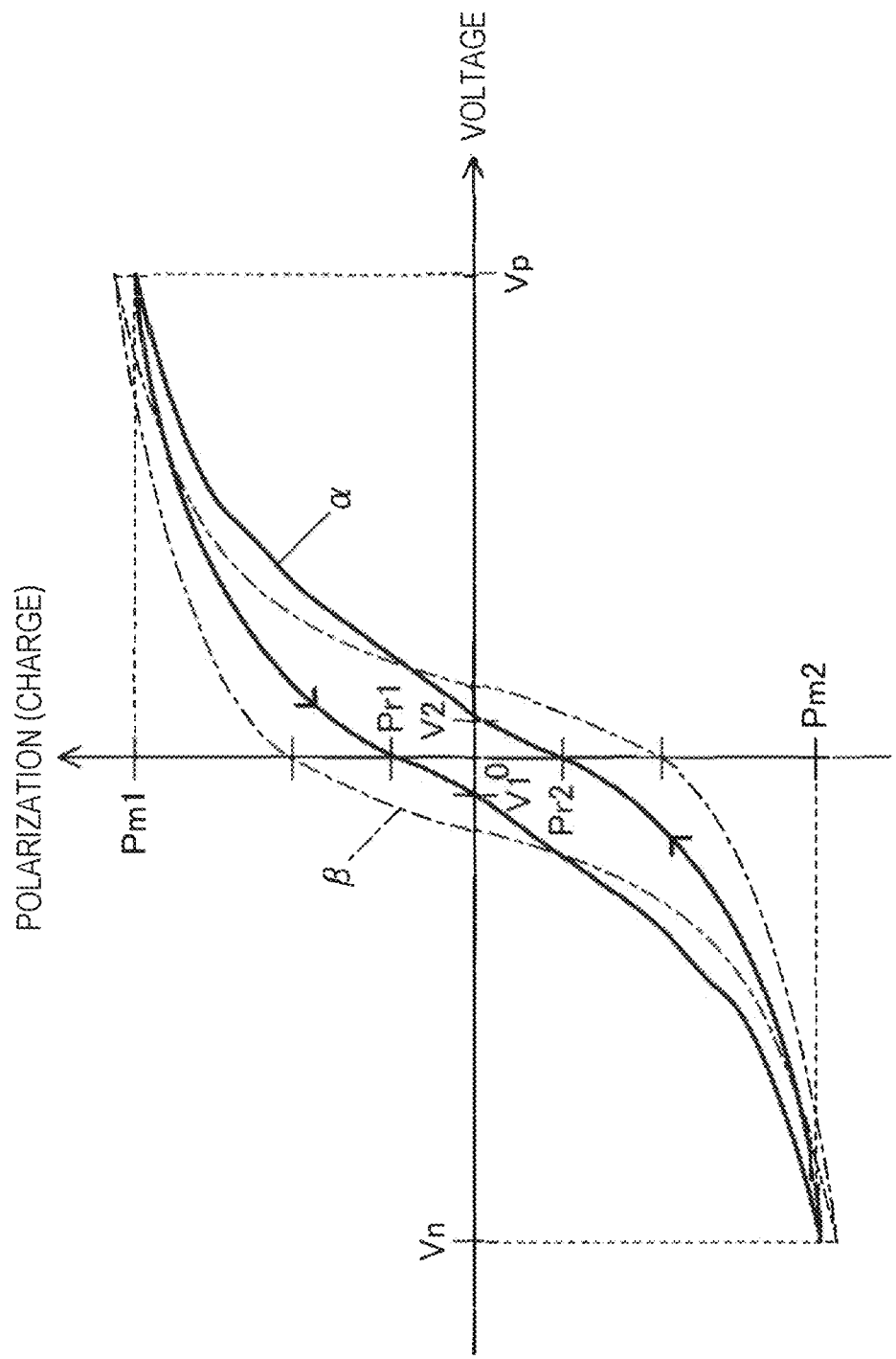
FIG. 6 is a graph that shows a relationship between voltage and polarization of a piezoelectric body according to an exemplary embodiment.

FIG. 6 is a graph that shows a relationship between voltage and polarization of the piezoelectric body 443 according to an exemplary embodiment. In FIG. 6, a solid curve shows the characteristics α of the piezoelectric body 443. In FIG. 6, a broken curve shows the characteristics β of a piezoelectric body according to related art. The horizontal axis of FIG. 6 represents voltage. The vertical axis of FIG. 6 represents polarization.

As illustrated in FIG. 6, the absolute value of positive remanent polarization Pr1 or negative remanent polarization Pr2 of the piezoelectric body 443 is less than the absolute value of positive remanent polarization Pr1X or negative remanent polarization Pr2X of the piezoelectric body according to related art. In the example illustrated in FIG. 6, the remanent polarization Pr1 of the piezoelectric body 443 is closer to zero polarization than to a point of positive saturation polarization Pm1 of the piezoelectric body 443. Similarly, the remanent polarization Pr2 of the piezoelectric body 443 is closer to zero polarization than to a point of negative saturation polarization Pm2 of the piezoelectric body 443. The point of saturation polarization Pmt corresponds to a positive saturation voltage Vp, which will be described later, and has a polarization value at which electric charge produced on the piezoelectric body 443 becomes saturated. Similarly, the point of saturation polarization Pm2 corresponds to a negative saturation voltage Vn, which will be described later, and has a polarization value at which electric charge produced on the piezoelectric body 443 becomes saturated.

In the example illustrated in FIG. 6, the absolute value of electric charge produced on the piezoelectric body 443 when the voltage applied between the first electrode 441 and the second electrode 442 is the positive saturation voltage Vp is substantially equal to the absolute value of electric charge produced on the piezoelectric body 443 when the voltage applied between the first electrode 441 and the second electrode 442 is the negative saturation voltage Vn. In addition, the absolute value of the positive saturation voltage Vp is substantially equal to the absolute value of the negative saturation voltage Vn. The phrase "substantially equal to" as used herein encompasses the meaning of not only exact equality but also rough or approximate equality in which a measurement error, etc. is tolerated.

When the voltage applied between the first electrode 441 and the second electrode 442 is changed from the negative saturation voltage Vn to the positive saturation voltage Vp, the remanent polarization Pr2 of the piezoelectric body 443 has a negative value. In addition, in this case, the coercive electric field of the piezoelectric body 443 has a positive value. The coercive electric field corresponds to voltage V2.

When the voltage applied between the first electrode 441 and the second electrode 442 is changed from the positive saturation voltage Vp to the negative saturation voltage Vn, the remanent polarization Pr1 of the piezoelectric body 443 has a positive value. In addition, in this case, the coercive electric field of the piezoelectric body 443 has a negative value. The coercive electric field corresponds to voltage V1.

Making the absolute value of the remanent polarization Pr1 and the remanent polarization Pr2 smaller as described above makes it easier for the polarization direction of the piezoelectric body 443 to change near the timing at which the voltage becomes zero. Consequently, it is possible to achieve higher performance of the deformation of the piezoelectric body 443 in response to the applying of a drive voltage, as compared with that of related art.

Moreover, the absolute value of the remanent polarization Pr1 and the remanent polarization Pr2 is greater than zero, although made smaller. If the remanent polarization Pr1 and Pr2 is zero, which means anti-ferroelectric crystal, there is a risk of a problem that an absolute value of an electric current will be excessive, resulting in burdening the piezoelectric body 443, making the electric current unstable, making the deformation unstable, and the like. Therefore, the absolute value of the remanent polarization Pr1 and the remanent polarization Pr2 is set to be greater than zero.

However, if the absolute value of the remanent polarization Pr1 and the remanent polarization Pr2 is excessively large, it is difficult for the polarization direction of the piezoelectric layer to change in the neighborhood of the zero voltage. Specifically, preferably, the difference between the remanent polarization Pr1 and zero polarization may be less than the difference between the remanent polarization Pr1 and the point of saturation polarization Pm1 corresponding to the positive saturation voltage, and the difference between the remanent polarization Pr2 and zero polarization may be less than the difference between the remanent polarization Pr2 and the point of saturation polarization Pm2 corresponding to the negative saturation voltage.

Furthermore, as compared with related art, it is possible to increase an amount of change in polarization in relation to a change in voltage near the timing at which the voltage becomes zero. Therefore, also in this respect, it is possible to achieve higher performance of the deformation of the piezoelectric body 443 in response to the applying of a drive voltage, as compared with that of related art.

Figure 7:
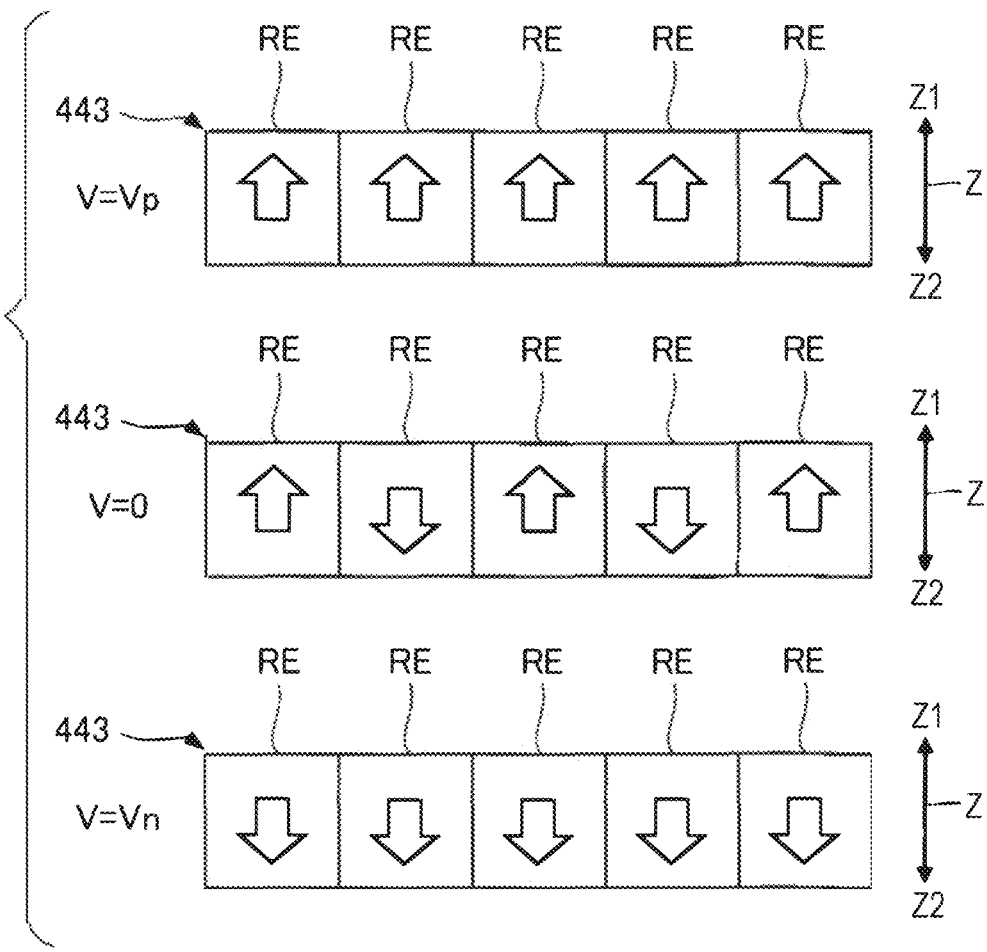
FIG. 7 is a diagram for explaining a change in the state of polarization of the piezoelectric body according to an exemplary embodiment.
Figure 8:
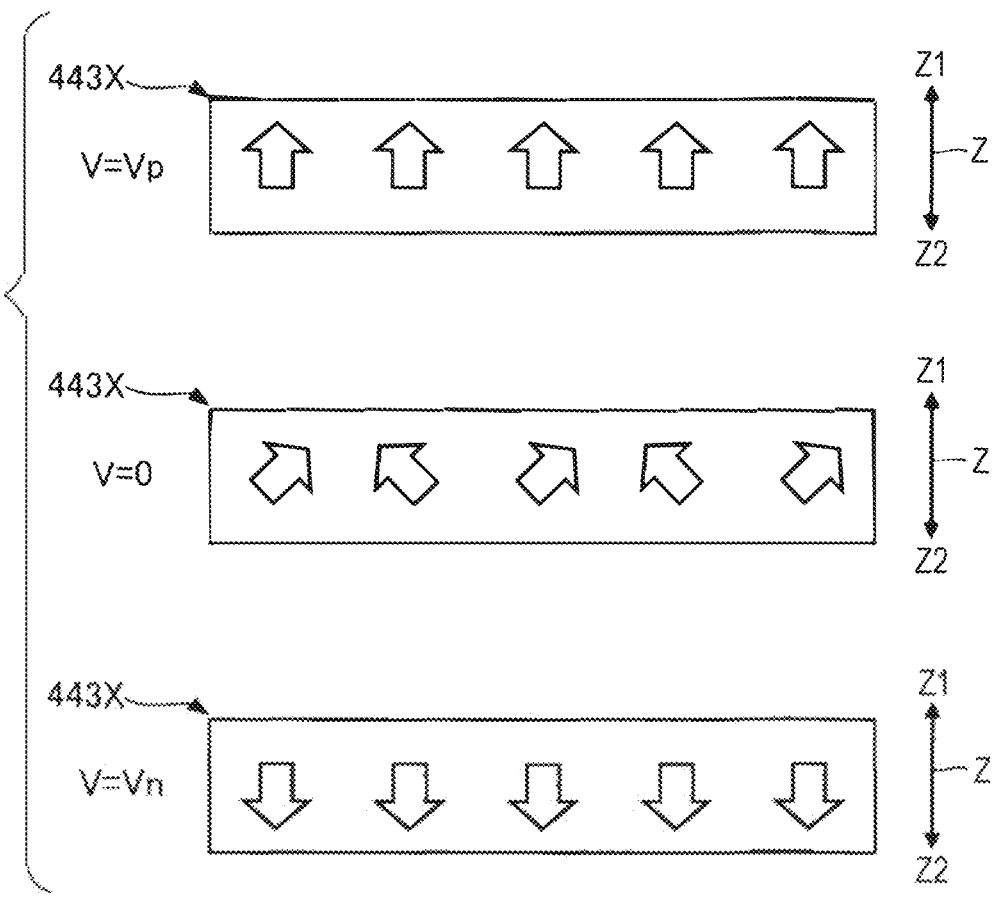
FIG. 8 is a diagram for explaining a change in the state of polarization of a piezoelectric body according to related art.

FIG. 7 is a diagram for explaining a change in the state of polarization of the piezoelectric body 443 according to an exemplary embodiment. FIG. 8 is a diagram for explaining a change in the state of polarization of a piezoelectric body 443X according to related art. In FIG. 7, a change in the state of polarization of the piezoelectric body 443 is schematically illustrated. In FIG. 8, a change in the state of polarization of the piezoelectric body 443X is schematically illustrated. In FIG. 7, the direction of polarization at each part of the piezoelectric body 443 is schematically illustrated. In FIG. 8, the direction of polarization at each part of the piezoelectric body 443X is schematically illustrated.

As illustrated in FIG. 7, the piezoelectric body 443 is divided into a plurality of domains RE, and the state of polarization switches individually for each of the plurality of domains RE. These domains RE are realized by making the absolute value of the remanent polarization Pr1 and the remanent polarization Pr2 smaller.

As illustrated in the top part of FIG. 7, the direction of polarization is the same in one direction along the Z axis when the voltage applied to the piezoelectric body 443 is the positive saturation voltage Vp. As illustrated in the bottom part of FIG. 7, the direction of polarization is the same in the other direction along the Z axis when the voltage applied to the piezoelectric body 443 is the negative saturation voltage Vn. This is the same for the piezoelectric body 443X according to related art.

As illustrated in the middle part of FIG. 7, when the voltage applied to the piezoelectric body 443 is zero voltage, the direction of polarization of a part of the plurality of domains RE is one direction along the Z axis, and the direction of polarization of the rest of the plurality of domains RE is the other direction along the Z axis. The number of the domains RE oriented in the one direction along the Z axis is larger than the number of the domains RE oriented in the other direction along the Z axis. Therefore, it is possible to change between the above-described state illustrated in the top part, or the bottom part, of FIG. 7 and the above-described state illustrated in the middle part of FIG. 7 smoothly.

By contrast, as illustrated in the middle part of FIG. 8, when the voltage applied to the piezoelectric body 443X is zero voltage, the direction of polarization is randomly inclined with respect to the Z axis. Such a state is less stable than the state illustrated in the middle part of FIG. 7 mentioned above. Therefore, it is difficult to change from the above-described state illustrated in the top part, or the bottom part, of FIG. 8 to the above-described state illustrated in the middle part of FIG. 8 smoothly.

As will be understood from the above description, making the absolute value of the remanent polarization Pr1 and the remanent polarization Pr2 smaller makes it easier for the polarization direction of the piezoelectric body 443 to change near the timing at which the voltage becomes zero.

Figure 9:
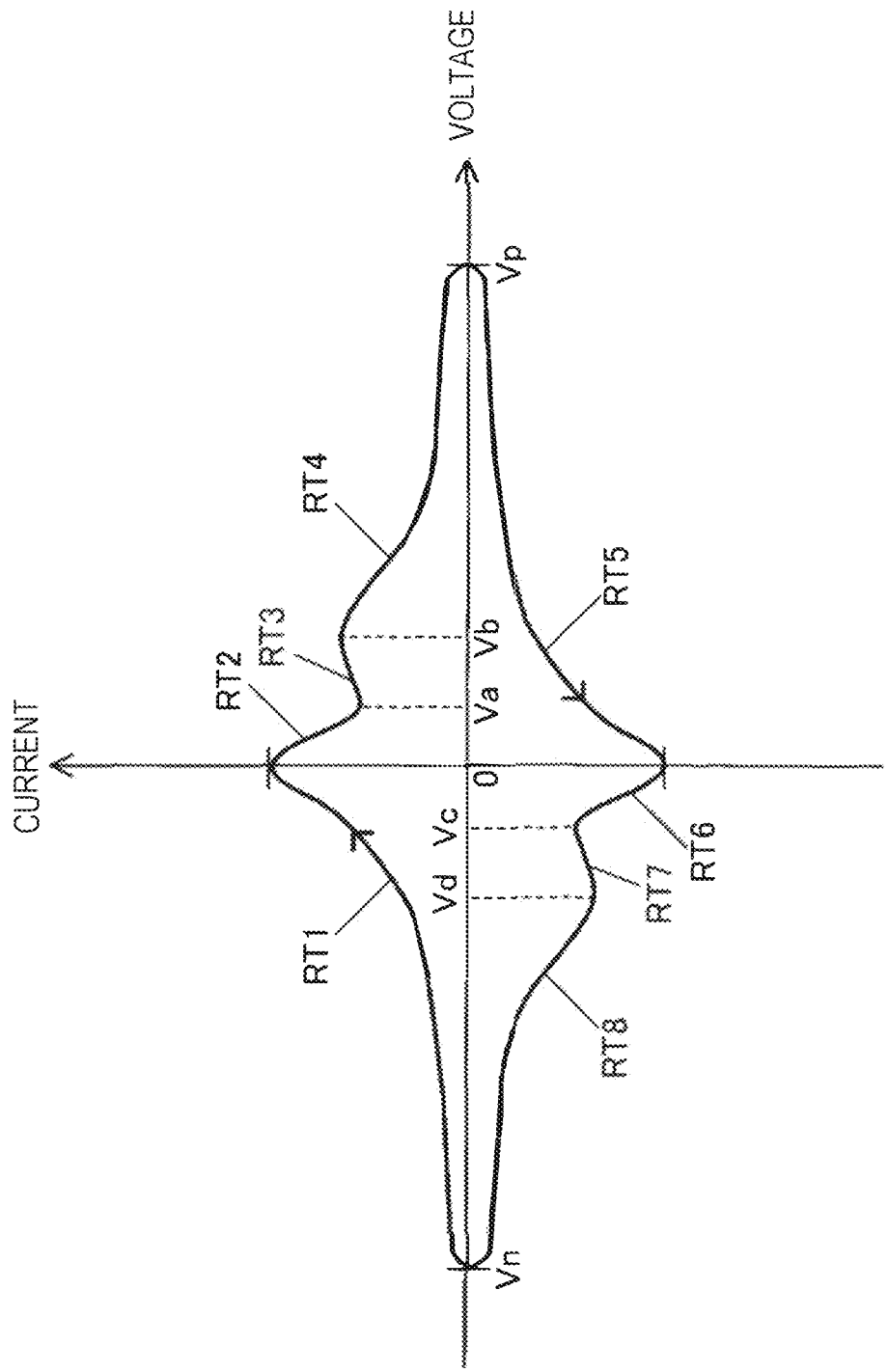
FIG. 9 is a graph that shows a relationship between voltage and current of the piezoelectric body according to an exemplary embodiment.

FIG. 9 is a graph that shows a relationship between voltage and current of the piezoelectric body 443 according to an exemplary embodiment. FIG. 9 illustrates a relationship between voltage and current of the piezoelectric body 443 when the voltage applied between the first electrode 441 and the second electrode 442 is changed progressively between the negative saturation voltage Vn and the positive saturation voltage Vp. The positive saturation voltage Vp is a positive voltage that is applied between the first electrode 441 and the second electrode 442 when electric charge produced on the piezoelectric body 443 becomes saturated. Similarly, the negative saturation voltage Vn is a negative voltage that is applied between the first electrode 441 and the second electrode 442 when electric charge produced on the piezoelectric body 443 becomes saturated.

As illustrated in FIG. 9, when the voltage applied between the first electrode 441 and the second electrode 442 is changed progressively from the negative saturation voltage Vn to the positive saturation voltage Vp, an electric current based on electric charge produced on the piezoelectric body 443 changes by going through a first path RT1, a second path RT2, a third path RT3, and a fourth path RT4 in this order. A voltage Va in FIG. 9 is a voltage corresponding to a boundary between the second path RT2 and the third path RT3. A voltage Vb in FIG. 9 is a voltage corresponding to a boundary between the third path RT3 and the fourth path RT4.

On the first path RT1, the electric current becomes larger as the voltage becomes higher. On the second path RT2, the electric current becomes smaller as the voltage becomes higher. On the third path RT3, the electric current becomes larger as the voltage becomes higher. On the fourth path RT4, the electric current becomes smaller as the voltage becomes higher. Since the electric current based on electric charge produced on the piezoelectric body 443 changes by going through these paths, it is possible to make the absolute value of the remanent polarization Pr2 smaller as described earlier. This makes it easier for the polarization direction of the piezoelectric body 443 to change near the timing at which the voltage becomes zero.

In the example illustrated in FIG. 9, the voltage corresponding to the first path RT1 has a negative value. On the other hand, each of the voltage corresponding to the second path RT2, the voltage corresponding to the third path RT3, and the voltage corresponding to the fourth path RT4 has a positive value. In addition, the electric current on each of the first path RT1, the second path RT2, the third path RT3, and the fourth path RT4 has a positive value.

The electric current at the timing of switching from the first path RT1 to the second path RT2 is larger than the electric current at the timing of switching from the third path RT3 to the fourth path RT4. In other words, the maximum value of the electric current when switching from the first path RT1 to the second path RT2 occurs is greater than the maximum value of the electric current when switching from the third path RT3 to the fourth path RT4 occurs. When this relationship holds between the maximum values, as compared with a case where this relationship does not hold, it is easier for the polarization direction of the piezoelectric body 443 to change near the timing at which the voltage becomes zero.

The change width of the voltage corresponding to the second path RT2 is less than each of the change width of the voltage corresponding to the first path RT1, the change width of the voltage corresponding to the third path RT3, and the change width of the voltage corresponding to the fourth path RT4. Advantageously, in this case, it is easier to make an amount of change in polarization in relation to a change in voltage larger than otherwise.

When the voltage applied between the first electrode 441 and the second electrode 442 is changed progressively from the positive saturation voltage Vp to the negative saturation voltage Vn, the electric current changes by going through a fifth path RT5, a sixth path RT6, a seventh path RT7, and an eighth path RT8 in this order. A voltage Vc in FIG. 9 is a voltage corresponding to a boundary between the sixth path RT6 and the seventh path RT7. A voltage Vd in FIG. 9 is a voltage corresponding to a boundary between the seventh path RT7 and the eighth path RT8.

On the fifth path RT5, the electric current becomes smaller as the voltage becomes lower. On the sixth path RT6, the electric current becomes larger as the voltage becomes lower. On the seventh path RT7, the electric current becomes smaller as the voltage becomes lower. On the eighth path RT8, the electric current becomes larger as the voltage becomes lower. Since the electric current based on electric charge produced on the piezoelectric body 443 changes by going through these paths, it is possible to make the absolute value of the remanent polarization Pr1 smaller as described earlier. This makes it easier for the polarization direction of the piezoelectric body 443 to change near the timing at which the voltage becomes zero.

In the example illustrated in FIG. 9, the voltage corresponding to the fifth path RT5 has a positive value. On the other hand, each of the voltage corresponding to the sixth path RT6, the voltage corresponding to the seventh path RT7, and the voltage corresponding to the eighth path RT8 has a negative value. In addition, the electric current on each of the fifth path RT5, the sixth path RT6, the seventh path RT7, and the eighth path RT8 has a negative value.

The electric current at the timing of switching from the fifth path RT5 to the sixth path RT6 is smaller than the electric current at the timing of switching from the seventh path RT7 to the eighth path RT8. In other words, the minimum value of the electric current when switching from the fifth path RT5 to the sixth path RT6 occurs is less than the minimum value of the electric current when switching from the seventh path RT7 to the eighth path RT8 occurs. When this relationship holds between the minimum values, as compared with a case where this relationship does not hold, it is easier for the polarization direction of the piezoelectric body 443 to change near the timing at which the voltage becomes zero.

The change width of the voltage corresponding to the sixth path RT6 is less than each of the change width of the voltage corresponding to the fifth path RT5, the change width of the voltage corresponding to the seventh path RT7, and the change width of the voltage corresponding to the eighth path RT8. Advantageously, in this case, it is easier to make an amount of change in polarization in relation to a change in voltage larger than otherwise.

2. Variation Examples

The embodiments described as examples above can be modified in various ways. Some specific examples of modification that can be applied to the embodiments described above are described below. Two or more variation examples selected arbitrarily from the description below may be combined as long as they are not contradictory to each other or one another.

2-1. First Variation Example

In the foregoing embodiments, the liquid ejecting head 26 that includes the piezoelectric elements 44 and the pressure compartment substrate 34 having the pressure compartments C, which contain ink and inside which pressure is applied to ink by driving of the piezoelectric elements 44, has been described as examples. However, equipment, etc. in which the piezoelectric elements 44 are mounted is not limited to a liquid ejecting head. For example, the equipment may be other kind of a drive device such as a piezoelectric actuator that includes a piezoelectric element or a detection device such as a pressure sensor that includes a piezoelectric element, or the like.

2-2. Second Variation Example

In the foregoing embodiments, the first electrode 441 is described as an individual electrode, and the second electrode 442 is described as a common electrode. However, the present disclosure is not limited to such an example. The first electrode 441 may be a common electrode extending continuously throughout the plurality of piezoelectric elements 44. The second electrode 442 may be an individual electrode disposed individually for each of the plurality of piezoelectric elements 44. Both the first electrode 441 and the second electrode 442 may be individual electrodes.

2-3. Third Variation Example

In the foregoing embodiments, the liquid ejecting apparatus 100 that is a so-called serial-type liquid ejecting apparatus configured to reciprocate the traveler 242 on which the liquid ejecting head 26 is mounted has been described as examples. However, the present disclosure may be applied to a so-called line-type liquid ejecting apparatus in which the plural nozzles N are arranged throughout the entire width of the medium 12.

2-4. Fourth Variation Example

The liquid ejecting apparatus 100 disclosed as examples in the foregoing embodiments can be applied to not only print-only machines but also various kinds of equipment such as facsimiles and copiers, etc. The scope of application and use of the liquid ejecting apparatus according to the present disclosure is not limited to printing. For example, a liquid ejecting apparatus that ejects a colorant solution can be used as an apparatus for manufacturing a color filter of a liquid crystal display device. A liquid ejecting apparatus that ejects a solution of a conductive material can be used as a manufacturing apparatus for forming wiring lines and electrodes of a wiring substrate.

EXAMPLES

Some specific examples of the present disclosure will now be described. The scope of the present disclosure is not limited to the examples described below.

A. Production of Piezoelectric Element

A-1. First Example

First, a silicon dioxide film that has a thickness of 1,460 nm was formed as a first layer of a diaphragm by thermally oxidizing one surface of a monocrystalline silicon substrate having crystal face orientation (110).

Next, a zirconium oxide film that has a thickness of 400 nm was formed as a second layer of the diaphragm by depositing a zirconium film on the silicon dioxide film by DC sputtering and then by thermally oxidizing the zirconium film at 850° C.

A titanium film that has a thickness of 20 nm for a first layer of a first electrode, a platinum film that has a thickness of 80 nm for a second layer of the first electrode, an iridium film that has a thickness of 5 nm for a third layer of the first electrode, and a titanium film that has a thickness of 4 nm for a seed layer were formed respectively by deposition of titanium, platinum, iridium, and titanium in this order by DC sputtering.

After the above process, an MOD solution prepared by mixing Pb, Zr, and Ti at a ratio of Pb:Zr:Ti=118:52:48 was applied as a PZT precursor solution to the surface of the seed layer by spin coating. After the spin coating, a PZT crystallization film that has a thickness of 110 nm for a part of layers of a piezoelectric body was formed by performing heat processing for five minutes at 737° C. under oxygen atmosphere by RTA (rapid thermal annealing).

Next, the layers over the zirconium oxide film described above were patterned using an ion milling method so as to configure the first electrode as each individual electrode.

Next, five PZT crystallization film layers were formed as a stack by using the same method as the method used for forming the PZT crystallization film described above, thereby forming the piezoelectric body that is made of PZT and has a thickness of 1,085 nm.

After the above process, an iridium film that has a thickness of 5 nm for a first layer of a second electrode and a titanium film that has a thickness of 4 nm for a second layer of the second electrode were formed respectively on the piezoelectric body by deposition of iridium and titanium in this order by DC sputtering. Then, heat processing was performed for one minute at 740° C. under nitrogen atmosphere by lamp annealing.

Next, the piezoelectric body was patterned by ion milling together with the films for the first and second layers of the second electrode described above.

After the above process, an iridium film that has a thickness of 6 nm for a third layer of the second electrode and a titanium film that has a thickness of 25 nm for a fourth layer of the second electrode were formed respectively on the second layer of the second electrode by deposition of iridium and titanium in this order by DC sputtering.

Next, the second electrode that behaves as a common electrode was formed by patterning the films for the third and fourth layers of the second electrode described above by ion milling. Then, a stack of layers of NiCr and gold was formed by DC sputtering, and the stack of layers was patterned by etching, thereby forming wiring.

Finally, after cavities for pressure compartments were formed by etching the other surface of the monocrystalline silicon substrate, a protective film made of tantalum oxide was formed on the wall surface of the pressure compartments by sputtering.

A-2. Second Example

A piezoelectric element according to a second example was produced in a similar fashion as done in the first example described above, except that the first electrode is a common electrode and that the second electrode is an individual electrode.

Specifically, a first electrode that behaves as a common electrode, and a seed layer, were formed by forming a titanium film for a first layer of the first electrode, a platinum film for a second layer of the first electrode, an iridium film for a third layer of the first electrode, and a titanium film for the seed layer respectively after a diaphragm was formed in a similar fashion as done in the first example.

After the above process, a piezoelectric body that is made of PZT and has a thickness of 1,085 nm was formed by forming a stack of six PZT crystallization film layers on the seed layer by using the same method as that of the first example.

Next, an iridium film that has a thickness of 5 nm for a first layer of a second electrode and a titanium film that has a thickness of 4 nm for a second layer of the second electrode were formed respectively on the piezoelectric body by deposition of iridium and titanium in this order by DC sputtering. Then, heat processing was performed for one minute at 740° C. under nitrogen atmosphere by lamp annealing.

Then, an iridium film that has a thickness of 6 nm for a third layer of the second electrode and a titanium film that has a thickness of 25 nm for a fourth layer of the second electrode were formed respectively on the second layer of the second electrode by deposition of iridium and titanium in this order by DC sputtering.

Next, the second electrode that behaves as an individual electrode was formed by patterning the piezoelectric body together with the films for the first to fourth layers of the second electrode described above by ion milling.

Then, a stack of layers of NiCr and gold was formed by DC sputtering, and the stack of layers was patterned by etching, thereby forming wiring.

A-3. First Comparative Example

A piezoelectric layer according to a first comparative example was produced in a similar fashion as done in the first example described above, except that the heating temperature or the heating time in lamp annealing after the process of forming the second layer of the second electrode were changed. The heating temperature is 740° C. The heating time is 8 minutes.

A-4. Second Comparative Example

A piezoelectric layer according to a second comparative example was produced in a similar fashion as done in the first example described above, except that the heating temperature or the heating time in lamp annealing after the process of forming the second layer of the second electrode were changed. The heating temperature is 740° C. The heating time is 8 minutes.

B. Evaluation
B-1. Electric Characteristics

For each of the examples and the comparative examples described above, the electric characteristics of the piezoelectric element were measured based on a change in an electric current flowing through the piezoelectric element when a voltage having a triangular waveform was applied between the first electrode and the second electrode. The results of the measurement are illustrated in FIGS. 10 to 13. The result for the second example was similar to the result for the first example, though not illustrated. The result for the second comparative example was similar to the result for the first comparative example, though not illustrated.

Figure 10:
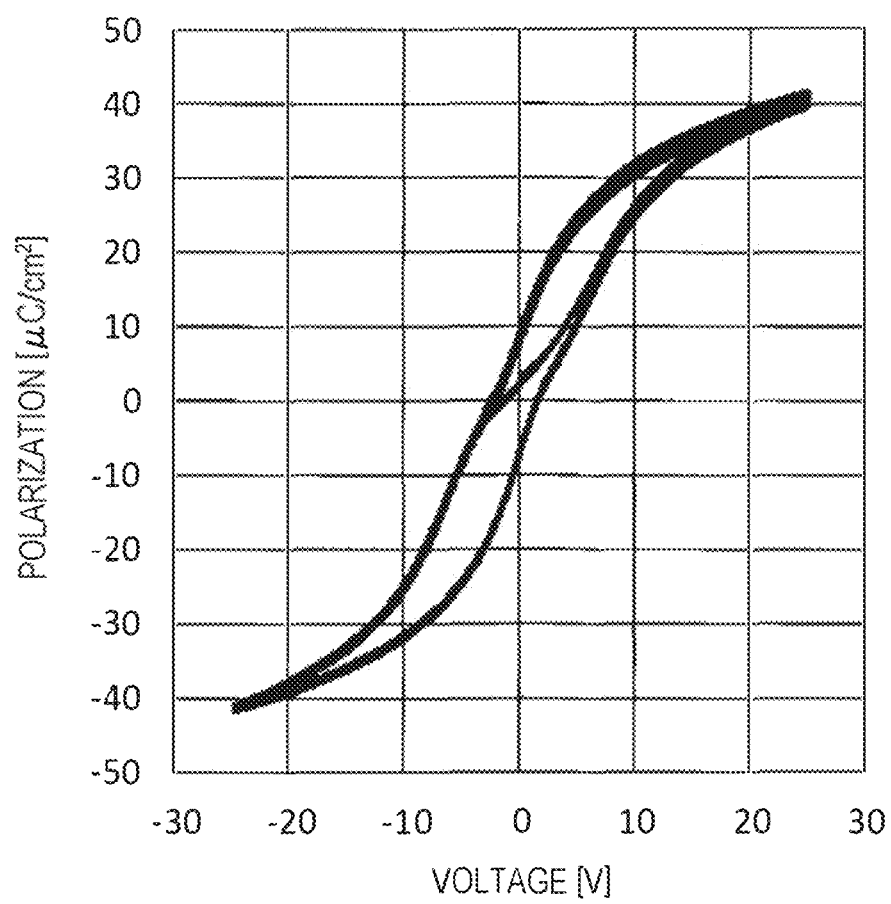
FIG. 10 is a graph that shows a relationship between voltage and polarization of a piezoelectric body according to a first example.
Figure 12:
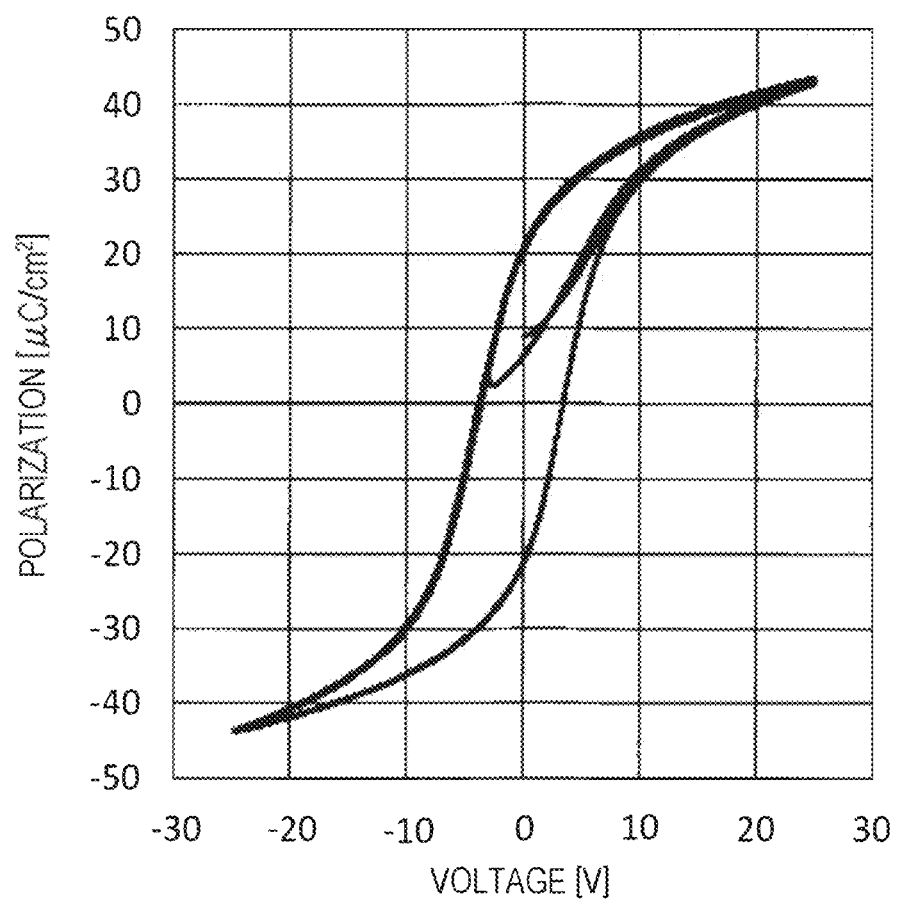
FIG. 12 is a graph that shows a relationship between voltage and polarization of a piezoelectric body according to a first comparative example.

As illustrated in FIGS. 10 and 12, in the first example, as compared with the first comparative example, it is possible to make the absolute value of remanent polarization smaller; moreover, it is possible to increase an amount of change in polarization in relation to a change in voltage near the timing at which the voltage becomes zero.

Figure 11:
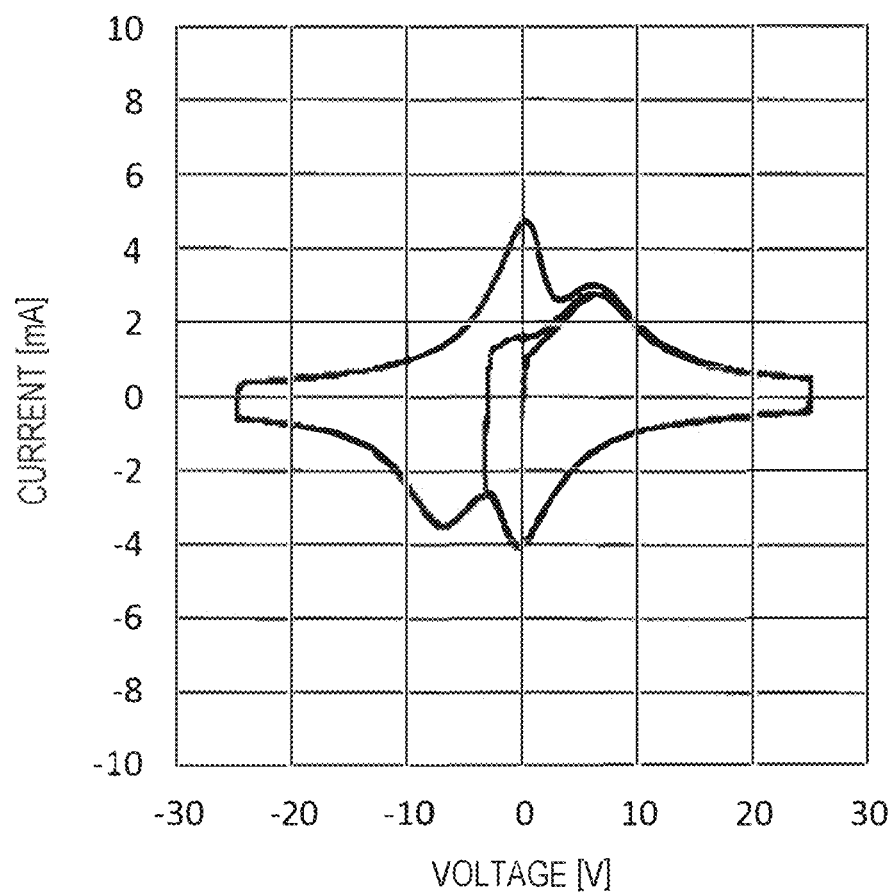
FIG. 11 is a graph that shows a relationship between voltage and current of the piezoelectric body according to the first example.
Figure 13:
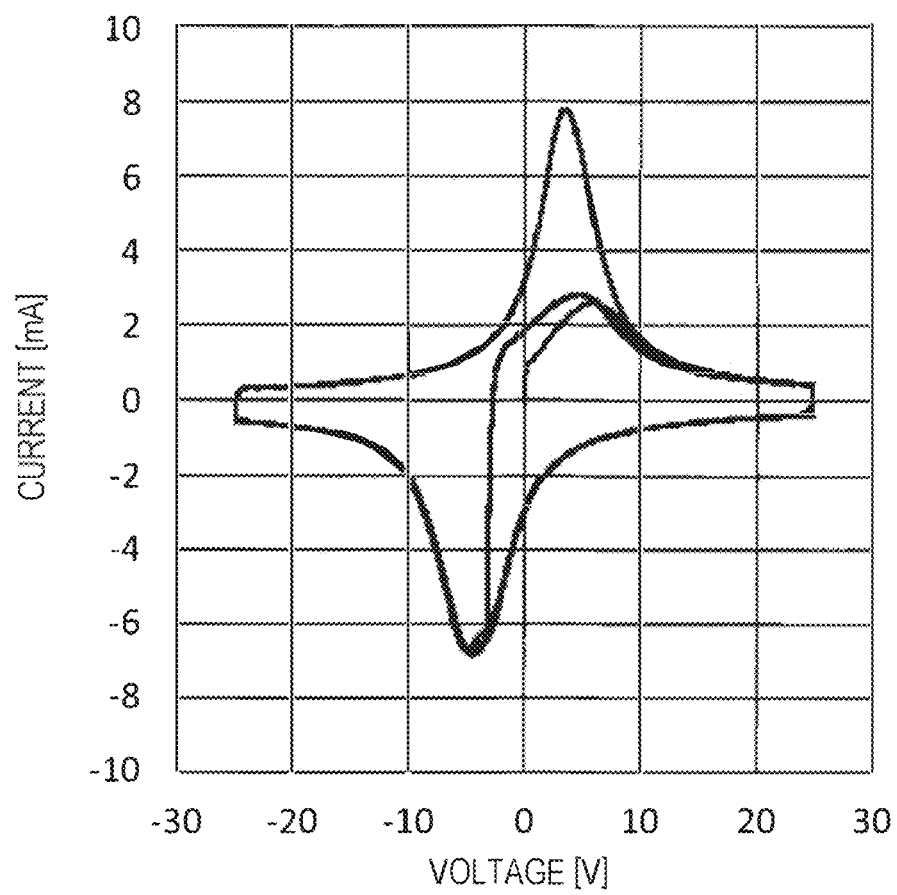
FIG. 13 is a graph that shows a relationship between voltage and current of the piezoelectric body according to the first comparative example.

Furthermore, in the first example, the number of each of the maximum and minimum values is two as illustrated in FIG. 11, whereas, in the comparative example, the number of each of the maximum and minimum values is one as illustrated in FIG. 13.

B-2. Response Performance

Figure 14:
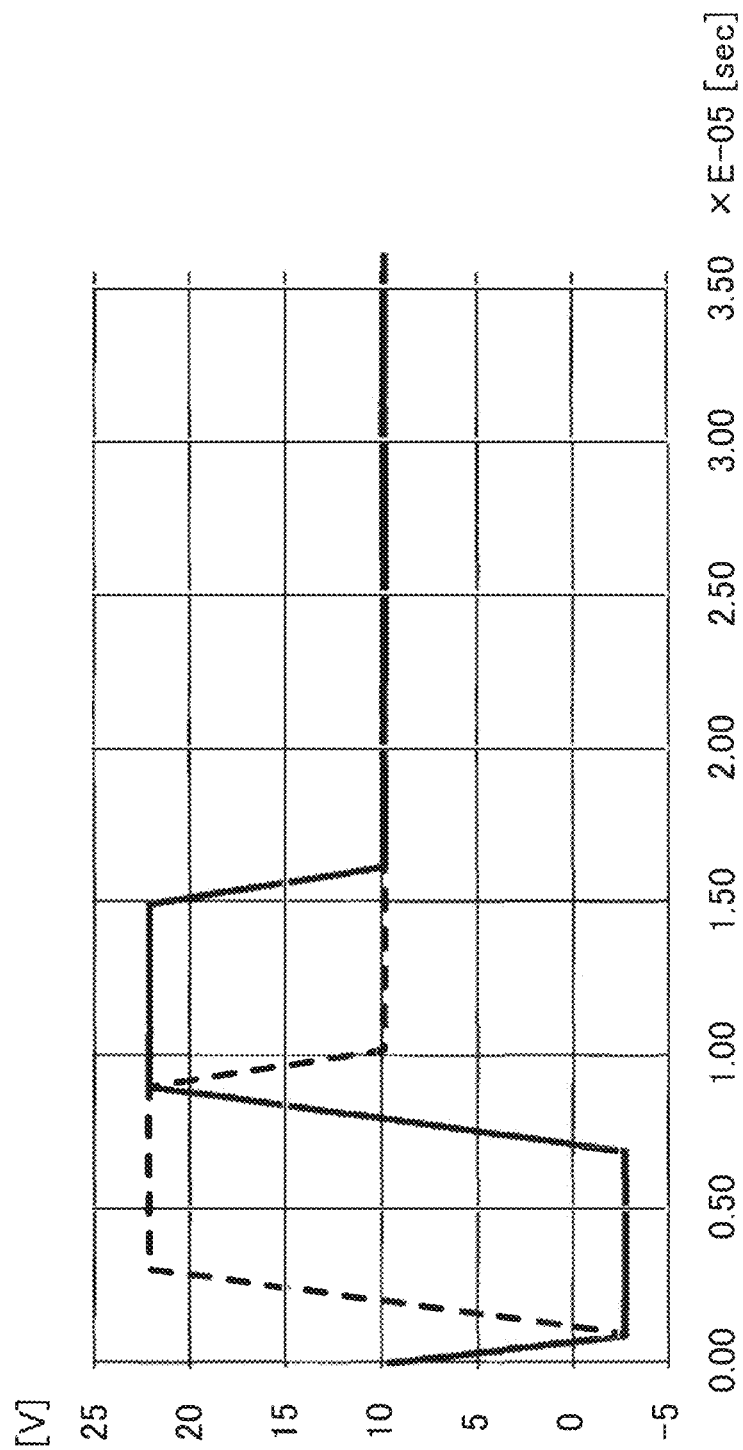
FIG. 14 is a diagram that illustrates a drive signal used for evaluation of response performance.

For each of the first example and the first comparative example, the response performance of the piezoelectric element was measured based on a change in an electric current flowing through the piezoelectric element when a drive signal represented by a solid line or a broken line in FIG. 14 was supplied between the first electrode and the second electrode.

The drive signal represented by the solid line in FIG. 14 has the following waveform. After the voltage is changed from 10 V to −2.5 V in 1 μsecond, the voltage is kept at −2.5 V for 6 μseconds. Next, after the voltage is changed from −2.5 V to 22.5 V in 2 μseconds, the voltage is kept at 22.5 V for 6 μseconds. Next, after the voltage is changed from 22.5 V to 10 V in 1 μsecond, the voltage is kept at 10 V for 6 μseconds. The drive signal represented by the broken line in FIG. 14 is the same as the drive signal represented by the solid line in FIG. 14 except that the time during which the voltage is kept at −2.5 V is omitted.

Figure 15:
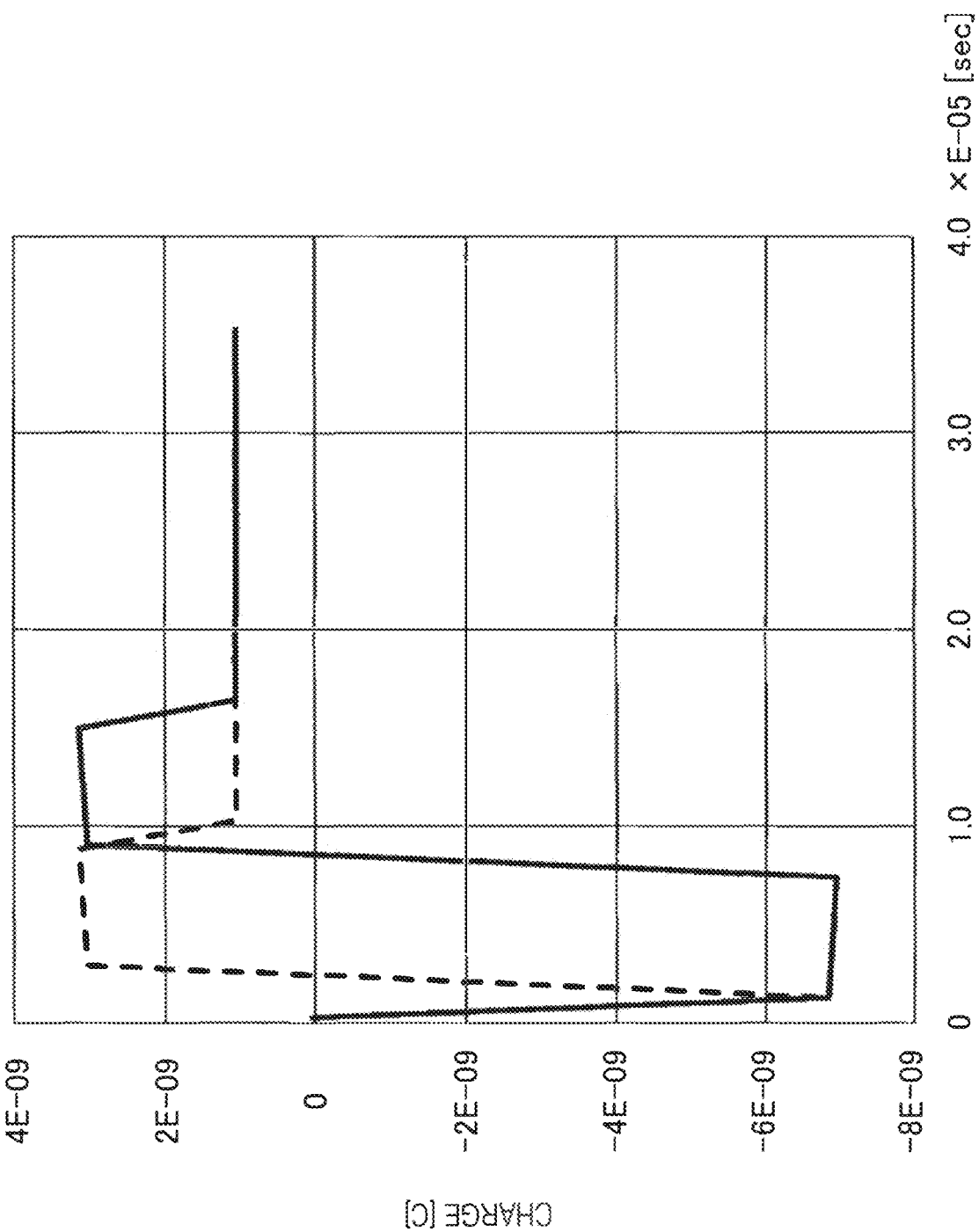
FIG. 15 is a diagram that illustrates the result of evaluation of response performance according to the first example.
Figure 16:
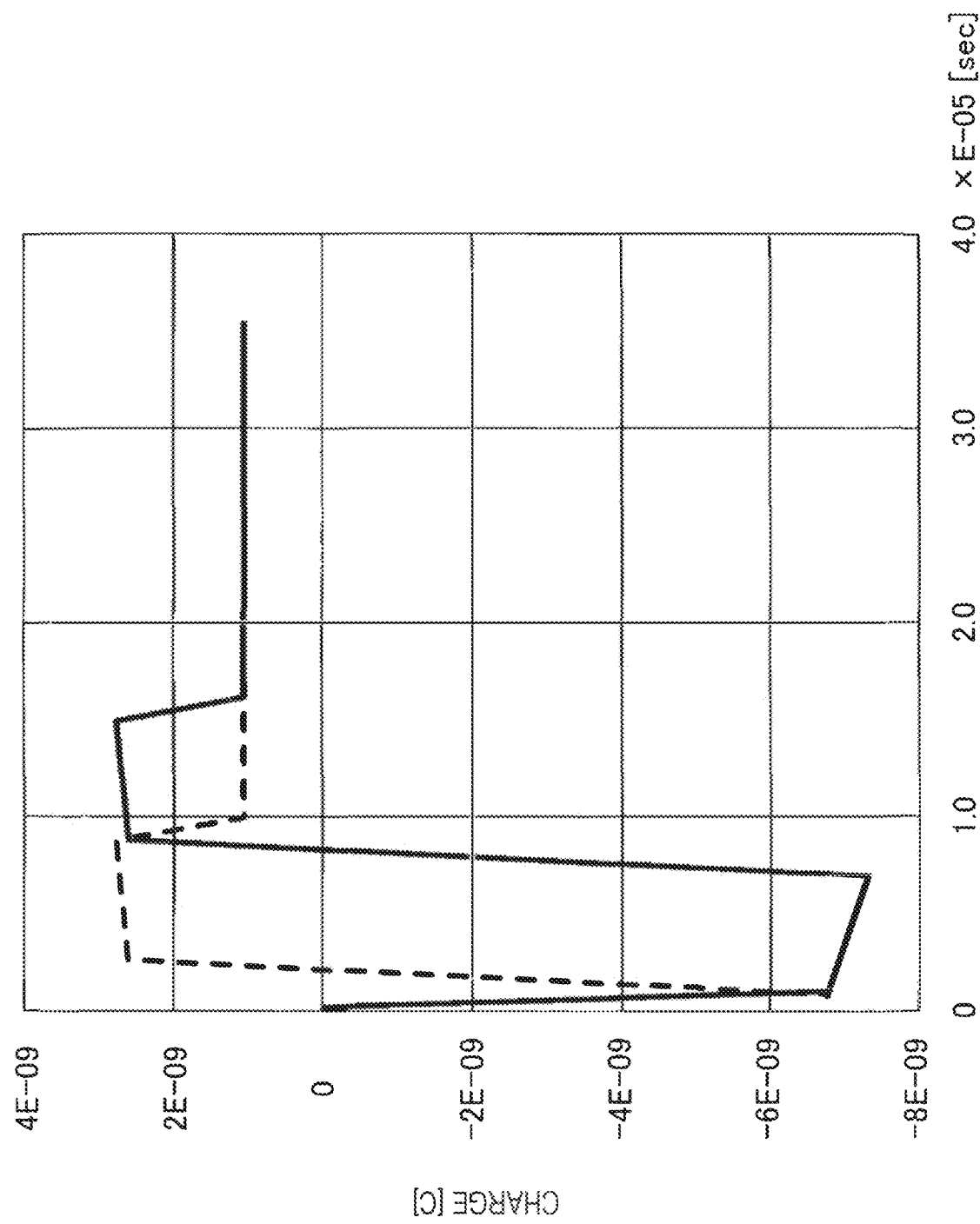
FIG. 16 is a diagram that illustrates the result of evaluation of response performance according to the first comparative example.

In FIG. 15, a solid line shows a change, over time, of electric charge produced on the piezoelectric body when the drive signal represented by the solid line in FIG. 14 is used in the first example. In addition, in FIG. 15, a broken line shows a change, over time, of electric charge produced on the piezoelectric body when the drive signal represented by the broken line in FIG. 14 is used in the first example. In FIG. 16, a solid line shows a change, over time, of electric charge produced on the piezoelectric body when the drive signal represented by the solid line in FIG. 14 is used in the first comparative example. In addition, in FIG. 16, a broken line shows a change, over time, of electric charge produced on the piezoelectric body when the drive signal represented by the broken line in FIG. 14 is used in the first comparative example.

As can be seen from these figures, a change in electric charge in a state in which the level of the drive voltage is kept in the first example is less than that of the first comparative example. Moreover, in the first example, it is possible to generate desired electric charge in shorter time, as compared with the first comparative example.

When a liquid ejecting apparatus using a liquid ejecting head provided with a piezoelectric element described in the first example or the second example performs liquid ejecting operation, preferably, a control section may apply either one of the following voltages (1) and (2) to the piezoelectric element. Applying either one of the following voltages (1) and (2) to the piezoelectric element makes it possible to achieve both excellent deformation of the piezoelectric element and a high speed, without decreasing electric efficiency wastefully.

(1) A voltage that is within a range from a voltage corresponding to the sixth path RT6 or the seventh path RT7 to a voltage corresponding to the fifth path RT5 inclusive is applied. More preferably, a voltage that is within a range from a border voltage at the boundary between the sixth path RT6 or the seventh path RT7, that is, the voltage Vc, to the positive saturation voltage Vp inclusive may be applied.

(2) A voltage that is within a range from a voltage corresponding to the first path RT1 to a voltage corresponding to the second path RT2 or the third path RT3 inclusive is applied. More preferably, a voltage that is within a range from the negative saturation voltage Vn to a border voltage at the boundary between the second path RT2 and the third path RT3, that is, the voltage Va, inclusive may be applied.

What is claimed is:
1. A piezoelectric element, comprising:
a first electrode;
a second electrode; and
a piezoelectric body disposed between the first electrode and the second electrode; wherein
let a positive saturation voltage be defined as a positive voltage applied between the first electrode and the second electrode when electric charge produced on the piezoelectric body becomes saturated,
let a negative saturation voltage be defined as a negative voltage applied between the first electrode and the second electrode when electric charge produced on the piezoelectric body becomes saturated, given the definition, when a voltage applied between the first electrode and the second electrode is changed progressively from the negative saturation voltage to the positive saturation voltage, an electric current based on electric charge produced on the piezoelectric body changes by going through a first path, a second path, a third path, and a fourth path in this order, on the first path, the electric current becomes larger as the voltage becomes higher, on the second path, the electric current becomes smaller as the voltage becomes higher, on the third path, the electric current becomes larger as the voltage becomes higher, and on the fourth path, the electric current becomes smaller as the voltage becomes higher.

2. The piezoelectric element according to claim 1, wherein, when the voltage applied between the first electrode and the second electrode is changed from the negative saturation voltage to the positive saturation voltage, remanent polarization of the piezoelectric body has a negative value.

3. The piezoelectric element according to claim 2, wherein, when the voltage applied between the first electrode and the second electrode is changed from the negative saturation voltage to the positive saturation voltage, a difference between the remanent polarization of the piezoelectric body and zero polarization is less than a difference between the remanent polarization of the piezoelectric body and saturation polarization corresponding to the negative saturation voltage.

4. The piezoelectric element according to claim 1, wherein, when the voltage applied between the first electrode and the second electrode is changed from the negative saturation voltage to the positive saturation voltage, a coercive electric field of the piezoelectric body has a positive value.

5. The piezoelectric element according to claim 1, wherein
the voltage corresponding to the first path has a negative value, and
each of the voltage corresponding to the second path, the voltage corresponding to the third path, and the voltage corresponding to the fourth path has a positive value.

6. The piezoelectric element according to claim 1, wherein the electric current at a timing of switching from the first path to the second path is larger than the electric current at a timing of switching from the third path to the fourth path.

7. The piezoelectric element according to claim 1, wherein a change width of the voltage corresponding to the second path is less than each of a change width of the voltage corresponding to the first path, a change width of the voltage corresponding to the third path, and a change width of the voltage corresponding to the fourth path.

8. The piezoelectric element according to claim 1, wherein the electric current on each of the first path, the second path, the third path, and the fourth path has a positive value.

9. The piezoelectric element according to claim 1, wherein,
when a voltage applied between the first electrode and the second electrode is changed progressively from the positive saturation voltage to the negative saturation voltage, an electric current based on electric charge produced on the piezoelectric body changes by going through a fifth path, a sixth path, a seventh path, and an eighth path in this order, on the fifth path, the electric current becomes smaller as the voltage becomes lower, on the sixth path, the electric current becomes larger as the voltage becomes lower, on the seventh path, the electric current becomes smaller as the voltage becomes lower, and on the eighth path, the electric current becomes larger as the voltage becomes lower.

10. The piezoelectric element according to claim 9, wherein, when the voltage applied between the first electrode and the second electrode is changed from the positive saturation voltage to the negative saturation voltage, remanent polarization of the piezoelectric body has a positive value.

11. The piezoelectric element according to claim 10, wherein, when the voltage applied between the first electrode and the second electrode is changed from the positive saturation voltage to the negative saturation voltage, a difference between the remanent polarization of the piezoelectric body and zero polarization is less than a difference between the remanent polarization of the piezoelectric body and saturation polarization corresponding to the positive saturation voltage.

12. The piezoelectric element according to claim 9, wherein, when the voltage applied between the first electrode and the second electrode is changed from the positive saturation voltage to the negative saturation voltage, a coercive electric field of the piezoelectric body has a negative value.

13. The piezoelectric element according to claim 9, wherein
the voltage corresponding to the fifth path has a positive value, and
each of the voltage corresponding to the sixth path, the voltage corresponding to the seventh path, and the voltage corresponding to the eighth path has a negative value.

14. The piezoelectric element according to claim 9, wherein the electric current at a timing of switching from the fifth path to the sixth path is smaller than the electric current at a timing of switching from the seventh path to the eighth path.

15. The piezoelectric element according to claim 9, wherein a change width of the voltage corresponding to the sixth path is less than each of a change width of the voltage corresponding to the fifth path, a change width of the voltage corresponding to the seventh path, and a change width of the voltage corresponding to the eighth path.

16. The piezoelectric element according to claim 9, wherein the electric current on each of the fifth path, the sixth path, the seventh path, and the eighth path has a negative value.

17. The piezoelectric element according to claim 9, wherein an absolute value of electric charge produced on the piezoelectric body when the voltage applied between the first electrode and the second electrode is the positive saturation voltage is substantially equal to an absolute value of electric charge produced on the piezoelectric body when the voltage applied between the first electrode and the second electrode is the negative saturation voltage.

18. The piezoelectric element according to claim 9, wherein an absolute value of the positive saturation voltage is substantially equal to an absolute value of the negative saturation voltage.

19. A piezoelectric element, comprising:
a first electrode;
a second electrode; and
a piezoelectric body disposed between the first electrode and the second electrode; wherein
let a positive saturation voltage be defined as a positive voltage applied between the first electrode and the second electrode when electric charge produced on the piezoelectric body becomes saturated,
let a negative saturation voltage be defined as a negative voltage applied between the first electrode and the second electrode when electric charge produced on the piezoelectric body becomes saturated,
given the definition, when a voltage applied between the first electrode and the second electrode is changed progressively from the positive saturation voltage to the negative saturation voltage, an electric current based on electric charge produced on the piezoelectric body changes by going through a fifth path, a sixth path, a seventh path, and an eighth path in this order,
on the fifth path, the electric current becomes smaller as the voltage becomes lower,
on the sixth path, the electric current becomes larger as the voltage becomes lower,
on the seventh path, the electric current becomes smaller as the voltage becomes lower, and
on the eighth path, the electric current becomes larger as the voltage becomes lower.

20. The piezoelectric element according to claim 19, wherein, when the voltage applied between the first electrode and the second electrode is changed from the positive saturation voltage to the negative saturation voltage, remanent polarization of the piezoelectric body has a positive value.

21. The piezoelectric element according to claim 20, wherein, when the voltage applied between the first electrode and the second electrode is changed from the positive saturation voltage to the negative saturation voltage, a difference between the remanent polarization of the piezoelectric body and zero polarization is less than a difference between the remanent polarization of the piezoelectric body and saturation polarization corresponding to the positive saturation voltage.

22. The piezoelectric element according to claim 19, wherein, when the voltage applied between the first electrode and the second electrode is changed from the positive saturation voltage to the negative saturation voltage, a coercive electric field of the piezoelectric body has a negative value.

23. The piezoelectric element according to claim 19, wherein
the voltage corresponding to the fifth path has a positive value, and
each of the voltage corresponding to the sixth path, the voltage corresponding to the seventh path, and the voltage corresponding to the eighth path has a negative value.

24. The piezoelectric element according to claim 19, wherein the electric current at a timing of switching from the fifth path to the sixth path is smaller than the electric current at a timing of switching from the seventh path to the eighth path.

25. The piezoelectric element according to claim 19, wherein a change width of the voltage corresponding to the sixth path is less than each of a change width of the voltage corresponding to the fifth path, a change width of the voltage corresponding to the seventh path, and a change width of the voltage corresponding to the eighth path.

26. The piezoelectric element according to claim 19, wherein the electric current on each of the fifth path, the sixth path, the seventh path, and the eighth path has a negative value.

27. The piezoelectric element according to claim 1, wherein the piezoelectric body is divided into a plurality of domains, and a state of polarization switches individually for each of the plurality of domains.

28. A liquid ejecting head, comprising:
the piezoelectric element according to claim 1; and
a pressure compartment substrate having a pressure compartment which contains liquid and inside which pressure is applied to the liquid by driving of the piezoelectric element.

29. A liquid ejecting apparatus, comprising:
the liquid ejecting head according to claim 28; and
a control section that controls the driving of the piezoelectric element.

30. The liquid ejecting apparatus according to claim 29, wherein the control section applies, between the first electrode and the second electrode, a voltage that is within a range from a voltage corresponding to the first path to a voltage corresponding to the second path or the third path inclusive.

31. The liquid ejecting apparatus according to claim 29, wherein the control section applies, between the first electrode and the second electrode, a voltage that is within a range from a voltage corresponding to the sixth path or the seventh path to a voltage corresponding to the fifth path inclusive.

* * * * *